(12) United States Patent
Suzuki et al.

(10) Patent No.: US 10,818,766 B2
(45) Date of Patent: Oct. 27, 2020

(54) ACTIVE MATRIX SUBSTRATE AND LIQUID CRYSTAL DISPLAY PANEL

(71) Applicant: Sharp Kabushiki Kaisha, Sakai, Osaka (JP)

(72) Inventors: Masahiko Suzuki, Sakai (JP); Hideki Kitagawa, Sakai (JP); Tetsuo Kikuchi, Sakai (JP); Toshikatsu Itoh, Sakai (JP); Setsuji Nishimiya, Sakai (JP); Teruyuki Ueda, Sakai (JP); Kengo Hara, Sakai (JP); Hajime Imai, Sakai (JP); Tohru Daitoh, Sakai (JP)

(73) Assignee: SHARP KABUSHIKI KAISHA, Sakai (JP)

( * ) Notice: Subject to any disclaimer, the term of this patent is extended or adjusted under 35 U.S.C. 154(b) by 0 days.

(21) Appl. No.: 16/497,893

(22) PCT Filed: Mar. 23, 2018

(86) PCT No.: PCT/JP2018/011652
§ 371 (c)(1),
(2) Date: Sep. 26, 2019

(87) PCT Pub. No.: WO2018/180968
PCT Pub. Date: Oct. 4, 2018

(65) Prior Publication Data
US 2020/0027958 A1 Jan. 23, 2020

(30) Foreign Application Priority Data
Mar. 30, 2017 (JP) ................................ 2017-068494

(51) Int. Cl.
*H01L 29/49* (2006.01)
*G02F 1/1368* (2006.01)
(Continued)

(52) U.S. Cl.
CPC ........ *H01L 29/4908* (2013.01); *G02F 1/1368* (2013.01); *H01L 21/022* (2013.01);
(Continued)

(58) Field of Classification Search
CPC ............... G02F 1/1368; H01L 21/0214; H01L 21/02164; H01L 21/0217; H01L 21/022;
(Continued)

(56) References Cited

U.S. PATENT DOCUMENTS 9,514,946 B2 * 12/2016 Inoue .................. H01L 21/0217
2012/0138922 A1 6/2012 Yamazaki et al.
(Continued)

FOREIGN PATENT DOCUMENTS

JP 2010-085501 A 4/2010
JP 2012-134475 A 7/2012
(Continued)

OTHER PUBLICATIONS

Official Communication issued in International Patent Application No. PCT/JP2018/011652, dated Jun. 19, 2018.

*Primary Examiner* — Nathanael R Briggs
(74) *Attorney, Agent, or Firm* — Keating & Bennett, LLP

(57) ABSTRACT

An active matrix substrate according to an embodiment of the present invention includes a plurality of thin film transistors supported on a substrate and an inorganic insulating layer covering the plurality of thin film transistors. Each thin film transistor includes a gate electrode, an oxide semiconductor layer, a gate insulating layer, a source electrode, and a drain electrode. At least one of the gate insulating layer and the inorganic insulating layer is an insulating layer stack having a multilayer structure including a silicon oxide layer and a silicon nitride layer. The insulating layer stack further includes an intermediate layer disposed between the silicon oxide layer and the silicon nitride layer, the intermediate
(Continued)

layer having a refractive index $n_C$ higher than a refractive index $n_A$ of the silicon oxide layer and lower than a refractive index $n_B$ of the silicon nitride layer.

6 Claims, 16 Drawing Sheets

(51) Int. Cl.
| | |
|---|---|
| *H01L 21/02* | (2006.01) |
| *H01L 27/12* | (2006.01) |
| *H01L 29/24* | (2006.01) |
| *H01L 29/51* | (2006.01) |
| *H01L 29/66* | (2006.01) |
| *H01L 29/786* | (2006.01) |

(52) U.S. Cl.
CPC ...... *H01L 21/0214* (2013.01); *H01L 21/0217* (2013.01); *H01L 21/02164* (2013.01); *H01L 21/02271* (2013.01); *H01L 21/02565* (2013.01); *H01L 27/127* (2013.01); *H01L 27/1225* (2013.01); *H01L 27/1251* (2013.01); *H01L 29/24* (2013.01); *H01L 29/513* (2013.01); *H01L 29/518* (2013.01); *H01L 29/66969* (2013.01); *H01L 29/7869* (2013.01); *H01L 29/78675* (2013.01)

(58) Field of Classification Search
CPC ......... H01L 21/02271; H01L 21/02565; H01L 27/1225; H01L 27/1251; H01L 27/127; H01L 29/4908; H01L 29/24; H01L 29/513; H01L 29/518; H01L 29/66969; H01L 29/78675; H01L 29/7869
See application file for complete search history.

(56) References Cited

U.S. PATENT DOCUMENTS

| | | |
|---|---|---|
| 2013/0320334 A1 | 12/2013 | Yamazaki et al. |
| 2014/0151685 A1* | 6/2014 | Tokunaga ......... H01L 29/78648 257/43 |
| 2014/0286076 A1 | 9/2014 | Aoki et al. |
| 2015/0277168 A1 | 10/2015 | Takanishi et al. |

FOREIGN PATENT DOCUMENTS

| | | |
|---|---|---|
| JP | 2014-007399 A | 1/2014 |
| JP | 2014-131022 A | 7/2014 |
| JP | 2014-209727 A | 11/2014 |
| WO | 2014/080826 A1 | 5/2014 |

* cited by examiner

FIG. 6
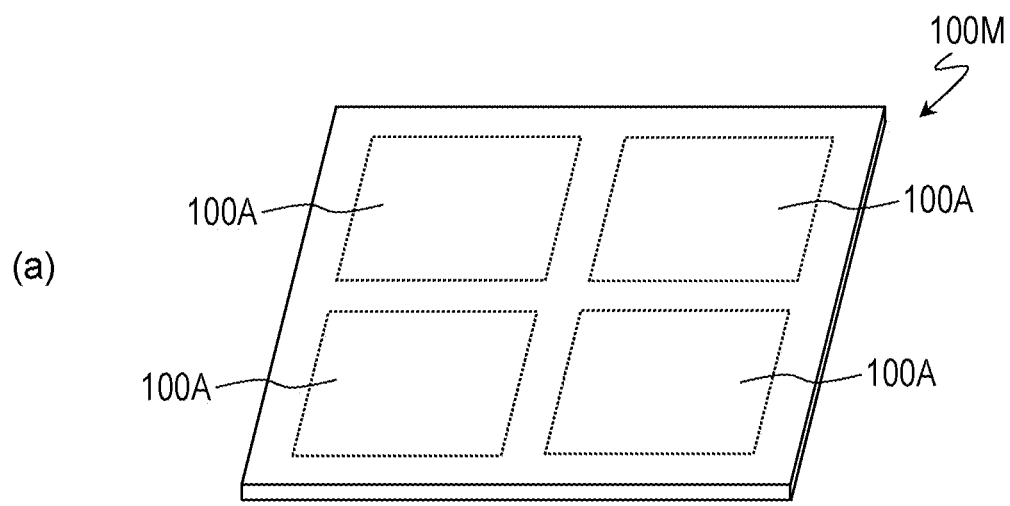
(a)
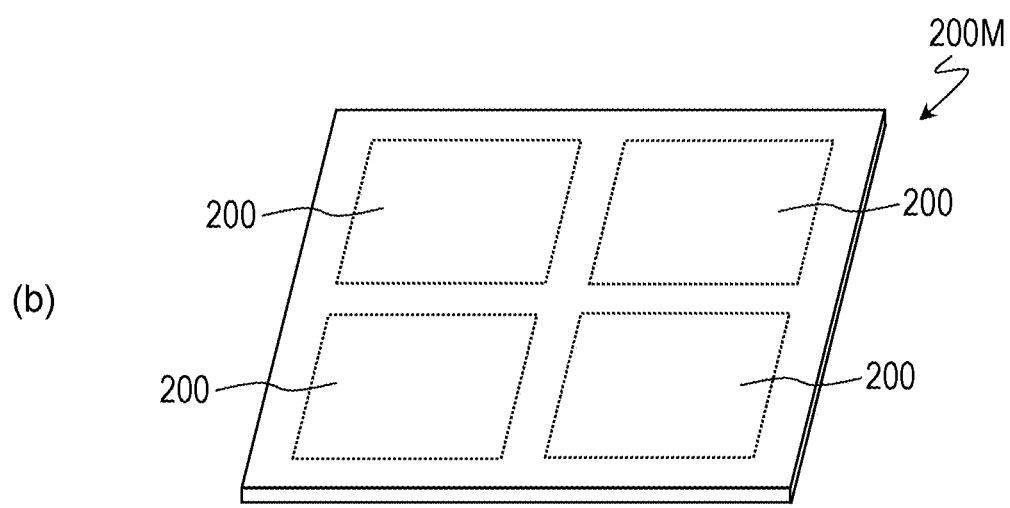
(b)

US 10,818,766 B2

ACTIVE MATRIX SUBSTRATE AND LIQUID CRYSTAL DISPLAY PANEL

TECHNICAL FIELD

The present invention relates to active matrix substrates and particularly relates to an active matrix substrate including an oxide semiconductor TFT. The present invention also relates to a liquid crystal display panel including such an active matrix substrate.

BACKGROUND ART

Active matrix substrates used for liquid crystal displays and the like include switching elements such as thin film transistors (hereinafter referred to as "TFTs") provided for corresponding pixels. Such switching elements that have been widely used include TFTs including amorphous silicon films as active layers (hereinafter referred to as "amorphous silicon TFTs") and TFTs including polycrystalline silicon films as active layers (hereinafter referred to as "polycrystalline silicon TFTs").

As alternatives to amorphous silicon and polycrystalline silicon, oxide semiconductors have recently been proposed as materials for active layers of TFTs. Such TFTs are referred to as "oxide semiconductor TFTs". PTL 1 discloses an active matrix substrate in which an In—Ga—Zn—O-based semiconductor film is used as an active layer of a TFT.

Oxide semiconductors have higher mobility than amorphous silicon. Therefore, oxide semiconductor TFTs can function faster than amorphous silicon TFTs. Oxide semiconductor films are formed by simpler processes than those for polycrystalline silicon films and thus can be applied to devices requiring large areas.

PTL 2 discloses a configuration in which an inorganic insulating layer covering a bottom-gate oxide semiconductor TFT has a multilayer structure. Specifically, this inorganic insulating layer includes a silicon oxide layer and a silicon nitride layer, and the silicon nitride layer has a thickness of 35 nm to 75 nm. According to PTL 2, this configuration reduces malfunctions of oxide semiconductor TFTs disposed in a non-display area.

PTL 2 also discloses a configuration in which a gate insulating layer covering a gate electrode has a multilayer structure. Specifically, a configuration is disclosed in which a gate insulating layer includes a silicon nitride layer and a silicon oxide layer.

CITATION LIST

Patent Literature

PTL 1: Japanese Unexamined Patent Application Publication No. 2012-134475
PTL 2: International Publication No. 2014/080826

SUMMARY OF INVENTION

Technical Problem

However, the present inventors studied and found that when at least one of an inorganic insulating layer and a gate insulating layer has a multilayer structure as described above, a color shift during oblique observation (Off-Angle Color Shift) or a variation in tinge (white uniformity: WU) may occur in a plane of a mother substrate. This is because an in-plane variation in thickness of layers (insulating layers) constituting each of the inorganic insulating layer and the gate insulating layer is visually observed as a difference in interference color (which is caused by optical interference in the insulating layers).

When a liquid crystal display panel is actually produced, it is very difficult to avoid the occurrence of a variation in thickness of insulating layers in a plane of a mother substrate. In recent years, mother glass plates (mother substrates) have been upsized to increase the number of chamfers (the number of substrates that can be obtained from one mother glass plate), and the above-described tinge variation becomes significant as the size of mother substrate increases. Liquid crystal display panels produced by dividing a mother substrate having a great tinge variation in a plane will have a great tinge variation between the panels and/or in each panel plane.

The present invention has been made in view of the above problems, and an object thereof is to reduce tinge variation during the production of a liquid crystal display panel including an active matrix substrate that includes an oxide semiconductor TFT and a gate insulating layer and/or inorganic insulating layer having a multilayer structure.

Solution to Problem

An active matrix substrate according to an embodiment of the present invention is an active matrix substrate including a substrate, a plurality of thin film transistors supported on the substrate, and an inorganic insulating layer covering the plurality of thin film transistors. Each of the plurality of thin film transistors includes a gate electrode, an oxide semiconductor layer facing the gate electrode, a gate insulating layer located between the gate electrode and the oxide semiconductor layer, and a source electrode and a drain electrode that are electrically connected to the oxide semiconductor layer. At least one of the gate insulating layer and the inorganic insulating layer is an insulating layer stack having a multilayer structure including a silicon oxide layer and a silicon nitride layer. The insulating layer stack further includes an intermediate layer disposed between the silicon oxide layer and the silicon nitride layer, the intermediate layer having a refractive index $n_C$ higher than a refractive index $n_A$ of the silicon oxide layer and lower than a refractive index $n_B$ of the silicon nitride layer.

In an embodiment, the intermediate layer is a silicon oxynitride layer.

In an embodiment, the refractive index $n_A$ of the silicon oxide layer, the refractive index $n_B$ of the silicon nitride layer, and the refractive index $n_C$ of the intermediate layer satisfy the relation $1.13 \cdot n_A \leq n_C \leq 0.93 \cdot n_B$.

In an embodiment, the silicon oxide layer is located between the oxide semiconductor layer and the intermediate layer.

In an embodiment, of the gate insulating layer and the inorganic insulating layer, the gate insulating layer is the insulating layer stack including the intermediate layer.

In an embodiment, of the gate insulating layer and the inorganic insulating layer, the inorganic insulating layer is the insulating layer stack including the intermediate layer.

In an embodiment, the gate insulating layer and inorganic insulating layer are each the insulating layer stack including the intermediate layer.

An active matrix substrate according to an embodiment of the present invention is an active matrix substrate including a substrate, a plurality of thin film transistors supported on the substrate, and an inorganic insulating layer covering the plurality of thin film transistors. Each of the plurality of thin film transistors includes a gate electrode, an oxide semiconductor layer facing the gate electrode, a gate insulating layer located between the gate electrode and the oxide semiconductor layer, and a source electrode and a drain electrode that are electrically connected to the oxide semiconductor layer. At least one of the gate insulating layer and the inorganic insulating layer is an insulating layer stack having a multilayer structure including a first layer that is a silicon oxide layer and a second layer having a refractive index $n_E$ different from a refractive index $n_D$ of the first layer. The difference between the refractive index $n_D$ of the first layer and the refractive index $n_E$ of the second layer is 0.33 or less.

In an embodiment, the second layer is a silicon oxynitride layer.

In an embodiment, the first layer is located between the oxide semiconductor layer and the second layer.

In an embodiment, of the gate insulating layer and the inorganic insulating layer, the gate insulating layer is the insulating layer stack.

In an embodiment, of the gate insulating layer and the inorganic insulating layer, the inorganic insulating layer is the insulating layer stack.

In an embodiment, the gate insulating layer and the inorganic insulating layer are each the insulating layer stack.

In an embodiment, the oxide semiconductor layer contains an In—Ga—Zn—O-based semiconductor.

In an embodiment, the In—Ga—Zn—O-based semiconductor has a crystalline portion.

A liquid crystal display panel according to an embodiment of the present invention includes an active matrix substrate having any of the configurations described above, an opposite substrate facing the active matrix substrate, and a liquid crystal layer disposed between the active matrix substrate and the opposite substrate.

Advantageous Effects of Invention

According to the embodiments of the present invention, tinge variation can be reduced during the production of a liquid crystal display panel including an active matrix substrate that includes an oxide semiconductor TFT and a gate insulating layer and/or inorganic insulating layer having a multilayer structure.

BRIEF DESCRIPTION OF DRAWINGS

FIGS. 6(a) and 6(b) are perspective views schematically illustrating a process for producing the liquid crystal display panel 300.

DESCRIPTION OF EMBODIMENTS

Hereinafter, embodiments of the present invention will be described with reference to the drawings. It should be noted that the present invention is not limited to the following embodiments.

Embodiment 1

Figure 1:
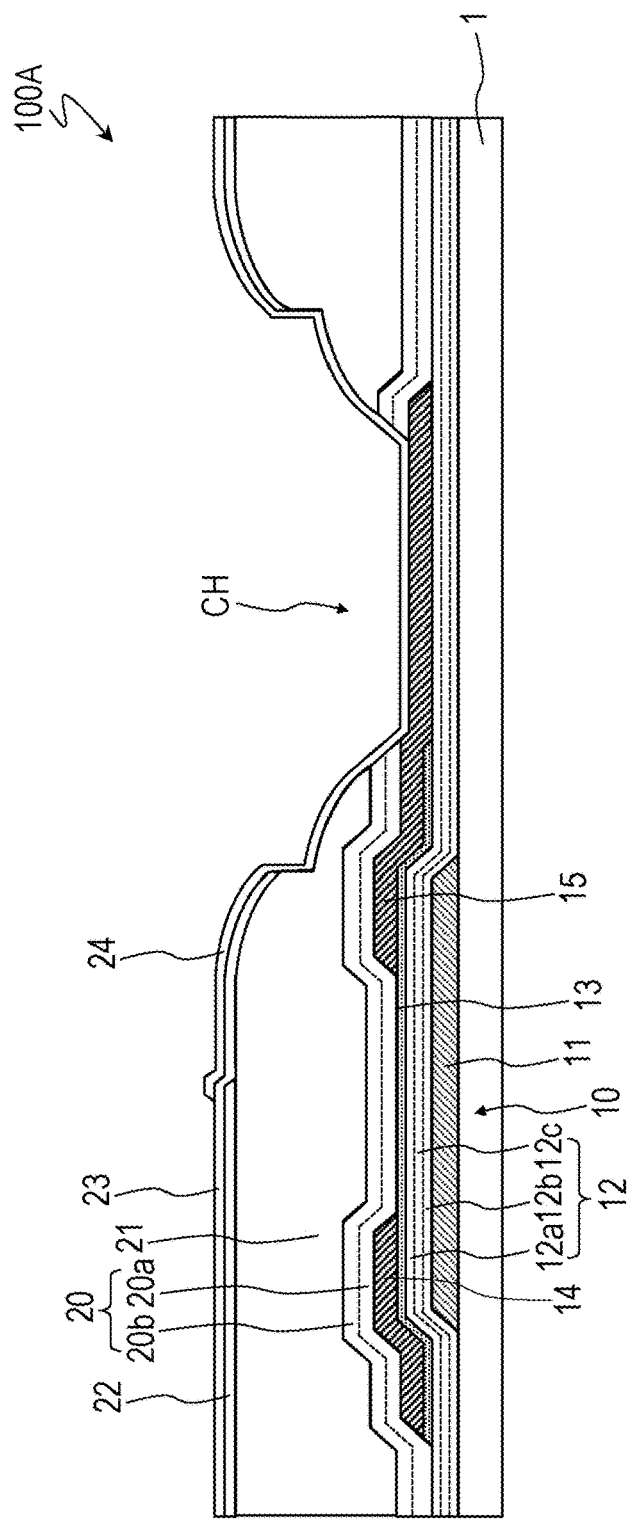
FIG. 1 is a sectional view schematically illustrating an active matrix substrate 100A according to an embodiment of the present invention.

An active matrix substrate 100A according to this embodiment will be described with reference to FIG. 1. FIG. 1 is a sectional view schematically illustrating the active matrix substrate 100A. FIG. 1 illustrates the active matrix substrate 100A used for an FFS (Fringe Field Switching) mode liquid crystal display panel.

The active matrix substrate 100A includes a substrate 1, a plurality of thin film transistors (TFTs) 10 supported on the substrate 1, and an inorganic insulating layer 20 covering the plurality of thin film transistors 10, as illustrated in FIG. 1. FIG. 1 illustrates a region corresponding to one pixel of a liquid crystal display panel, and one TFT 10 provided in the pixel is illustrated. The active matrix substrate 100A further includes an organic insulating layer 21, a common electrode 22, a dielectric layer 23, and a pixel electrode 24.

The substrate 1 is an insulating transparent substrate. For example, the substrate 1 is a glass substrate.

Each of the plurality of TFTs 10 includes a gate electrode 11, a gate insulating layer 12, an oxide semiconductor layer 13, a source electrode 14, and a drain electrode 15. That is, the TFT 10 is an oxide semiconductor TFT.

The gate electrode 11 is disposed on the substrate 1. The gate electrode 11 is electrically connected to a scan line (gate line), which is not illustrated, and receives a scan signal (gate signal) from the scan line.

The gate insulating layer 12 covers the gate electrode 11. In this embodiment, the gate insulating layer 12 has a multilayer structure as described below.

The oxide semiconductor layer 13 is disposed on the gate insulating layer 12. The oxide semiconductor layer 13 faces the gate electrode 11 with the gate insulating layer 12 interposed therebetween. In other words, the gate insulating layer 12 is located between the gate electrode 11 and the oxide semiconductor layer 13.

The source electrode 14 and the drain electrode 15 are electrically connected to the oxide semiconductor layer 13. The source electrode 14 is electrically connected to a signal line (source line), which is not illustrated, and receives a display signal (source signal) from the signal line. The drain electrode 15 is electrically connected to the pixel electrode 24.

The inorganic insulating layer (passivation film) 20 covers the oxide semiconductor layer 13, the source electrode 14, and the drain electrode 15. In this embodiment, the inorganic insulating layer 20 has a multilayer structure as described below.

The organic insulating layer (planarization film) 21 is disposed on the inorganic insulating layer 20. The organic insulating layer 21 is formed of, for example, a photosensitive resin material.

The common electrode 22 is disposed on the organic insulating layer 21. The common electrode 22 is a single conductive film formed across a display area and is given a common potential in a plurality of pixels. The common electrode 22 is formed of a transparent conductive material (e.g., ITO or IZO).

The dielectric layer 23 is disposed so as to cover the common electrode 22. The dielectric layer 23 is, for example, a silicon nitride (SiNx) layer.

The pixel electrode 24 is disposed on the dielectric layer 23 in each pixel. The pixel electrode 24 is formed of a transparent conductive material (e.g., ITO or IZO). The pixel electrode 24 is connected to the drain electrode 15 of the TFT 10 in a contact hole CH formed through the inorganic insulating layer 20, the organic insulating layer 21, and the dielectric layer 23. Although not illustrated here, at least one slit is formed in the pixel electrode 24.

Subsequently, a configuration of the gate insulating layer 12 and the inorganic insulating layer 20 in this embodiment will be described in more detail.

The gate insulating layer 12 is an insulating layer stack having a multilayer structure including a silicon oxide (SiOx) layer 12a and a silicon nitride (SiNx) layer 12b. In the example illustrated in FIG. 1, the silicon nitride layer 12b is disposed as a lower layer, and the silicon oxide layer 12a is disposed as an upper layer.

The inorganic insulating layer 20 is an insulating layer stack having a multilayer structure including a silicon oxide (SiOx) layer 20a and a silicon nitride (SiNx) layer 20b. In the example illustrated in FIG. 1, the silicon oxide layer 20a is disposed as a lower layer, and the silicon nitride layer 20b is disposed as an upper layer.

In this embodiment, the gate insulating layer 12 further includes an intermediate layer 12c disposed between the silicon oxide layer 12a and the silicon nitride layer 12b, as illustrated in FIG. 1. The intermediate layer 12c has a refractive index $n_C$ higher than a refractive index $n_A$ of the silicon oxide layer 12a and lower than a refractive index $n_B$ of the silicon nitride layer 12b (i.e., $n_A < n_B < n_C$).

The presence of the above-described intermediate layer 12c in the gate insulating layer 12 can reduce tinge variation due to a difference in interference color. The reason for this will be described below in more detail.

Figure 2:
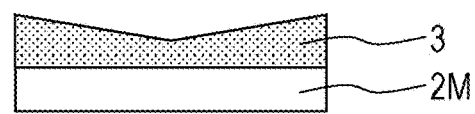
FIG. 2 illustrates how an insulating layer 3 formed on a mother substrate 2M has a variation in thickness.

Insulating layers (silicon nitride layers and silicon oxide layers) formed on a mother substrate by CVD, sputtering, or the like have variations in thickness in a plane of the mother substrate. Typically, as schematically illustrated in FIG. 2, the thickness of an insulating layer 3 increases from the center of a mother substrate 2M toward outer edges of the mother substrate 2M. Thus, the in-plane variation in thickness of the insulating layer 3 increases as the size of the mother substrate 2M increases. Therefore, the tinge variation due to a difference in interference color in a plane of the mother substrate 2M increases as the size of the mother substrate 2M increases.

In this embodiment, since the gate insulating layer 12 includes the intermediate layer 12c having a refractive index $n_C$ higher than a refractive index $n_A$ of the silicon oxide layer 12a and lower than a refractive index $n_B$ of the silicon nitride layer 12b, optical interference due to the multilayer structure of the gate insulating layer 12 is less likely to occur. Thus, tinge variation is reduced.

Figure 3:
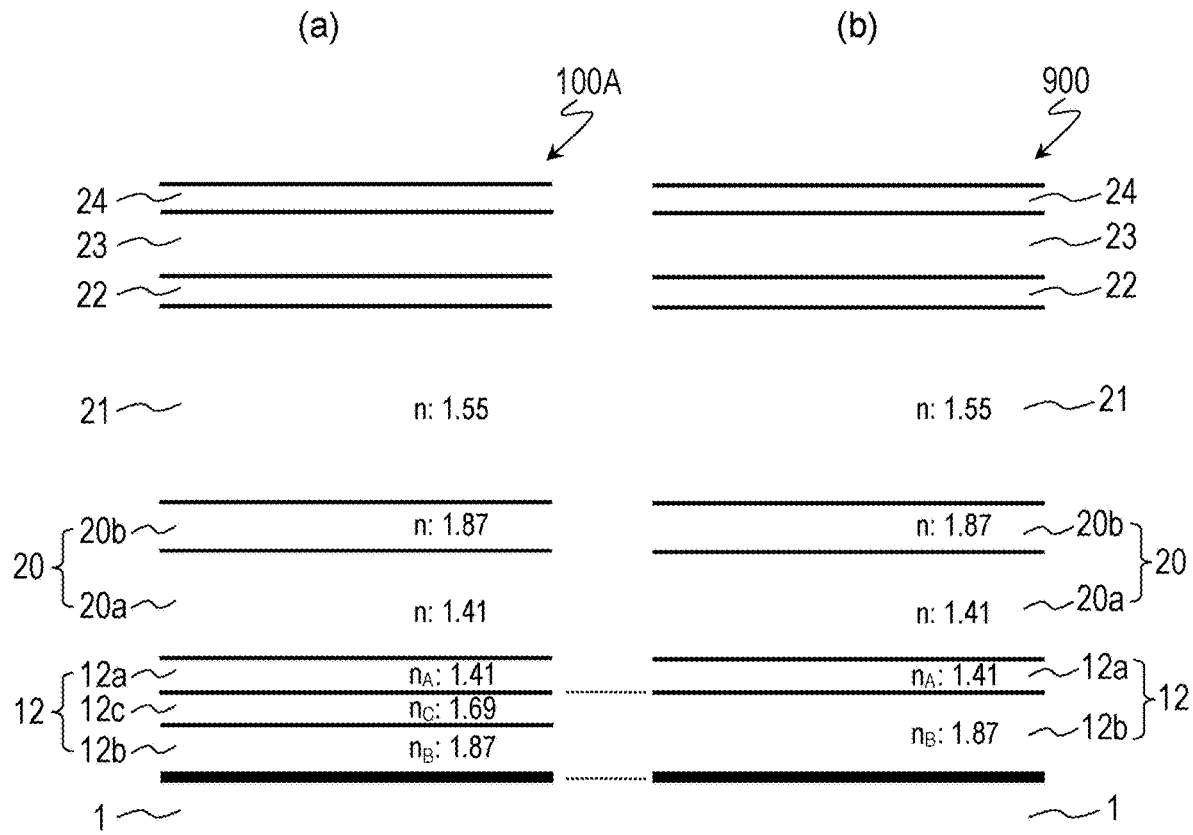
FIG. 3(a) schematically illustrates a multilayer structure of the active matrix substrate 100A, and FIG. 3(b) schematically illustrates a multilayer structure of an active matrix substrate 900 of Comparative Example.

FIG. 3(a) schematically illustrates a multilayer structure of the active matrix substrate 100A according to this embodiment, and FIG. 3(b) schematically illustrates a multilayer structure of an active matrix substrate 900 of Comparative Example. The active matrix substrate 900 of Comparative Example differs from the active matrix substrate 100 according to this embodiment in that the gate insulating layer 12 does not include the intermediate layer 12c. Examples of refractive indices of the insulating layers are also shown in FIGS. 3(a) and 3(b).

In the example illustrated in FIG. 3(a), the gate insulating layer 12 of the active matrix substrate 100A includes the intermediate layer 12c having a refractive index $n_C$ of 1.69 between the silicon oxide layer 12a having a refractive index $n_A$ of 1.41 and the silicon nitride layer 12b having a refractive index $n_B$ of 1.87. By contrast, in the example illustrated in FIG. 3(b), the gate insulating layer 12 of the active matrix substrate 900 of Comparative Example is composed only of the silicon oxide layer 12a having a refractive index $n_A$ of 1.41 and the silicon nitride layer 12b having a refractive index $n_B$ of 1.87. In both the examples in FIGS. 3(a) and 3(b), the refractive indices n of the silicon oxide layer 20a and the silicon nitride layer 20b of the inorganic insulating layer 20 and the refractive index n of the organic insulating layer 21 are 1.41, 1.87, and 1.55, respectively.

Figure 4:
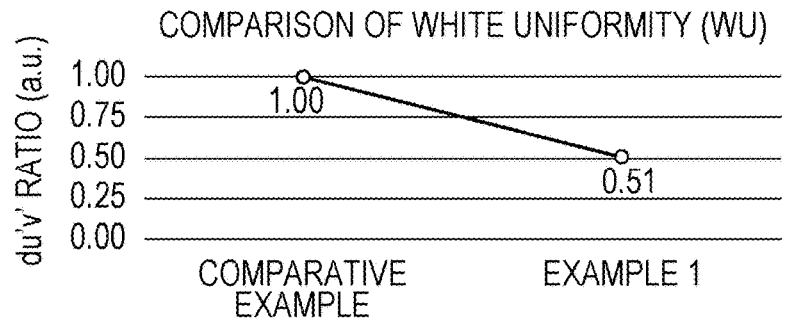
FIG. 4 is a graph showing the result of a comparison between a mother substrate of Example 1 and a mother substrate of Comparative Example in terms of white uniformity (WU) in planes of the mother substrates.

FIG. 4 shows the result of a comparison between a mother substrate including insulating layers having refractive indices set as in the example illustrated in FIG. 3(a) (Example 1) and a mother substrate including insulating layers having refractive indices set as in the example illustrated in FIG. 3(b) (Comparative Example) in terms of white uniformity (WU) in planes of the mother substrates. In FIG. 4, tinge variations (du'v') of Comparative Example and Example 1 are expressed as relative ratios (Comparative Example: 1.00). The thickness of each insulating layer of Comparative Example was set to be basically the same as the thickness of the corresponding insulating layer of Example 1; provided that the thickness of the silicon nitride layer 12b of the gate insulating layer 12 of Comparative Example was set to be the same as the total thickness of the silicon nitride layer 12b and the intermediate layer 12c of the gate insulating layer 12 of Example 1.

It can be seen from FIG. 4 that in Example 1, the white uniformity is about twice as high as (the tinge variation is about half as small as) that of Comparative Example.

As the intermediate layer 12c, for example, a silicon oxynitride (SiOxNy: x may be greater than or equal to y, or x may be less than y) layer can be suitably used. The refractive index of silicon oxynitride decreases (i.e., becomes closer to the refractive index of silicon oxide) as the oxygen content increases and increases (i.e., becomes closer to the refractive index of silicon nitride) as the nitrogen content increases. Thus, by using a silicon oxynitride layer as the intermediate layer 12c, the desired refractive index $n_C$ higher than the refractive index $n_A$ of the silicon oxide layer 12a and lower than the refractive index $n_B$ of the silicon nitride layer 12b can be readily achieved. In addition, by using a silicon oxynitride layer as the intermediate layer 12c, the intermediate layer 12c is readily formed. This is because it is relatively easy to perform a step of forming the silicon oxynitride layer 12c between a step of forming the silicon nitride layer 12b and a step of forming the silicon oxide layer 12a (e.g., these layers can successively be formed in the same chamber).

The results of a composition analysis of the silicon oxide layer 12a, the silicon nitride layer 12b, and the intermediate layer (silicon oxynitride layer) 12c of the gate insulating layer 12 of Example 1 are shown in Table 1 below. The composition analysis was performed by XPS (X-ray photoelectron spectroscopy). Needless to say, the composition ratio in the case where a silicon oxynitride layer is used as the intermediate layer 12c is not limited to the ratio shown in Table 1.

TABLE 1

|  | Si [atom %] | O [atom %] | N [atom %] |
|---|---|---|---|
| Silicon oxide layer | 33 | 67 | — |
| Silicon oxynitride layer | 42.5 | 23.5 | 34 |
| Silicon nitride layer | 47 | — | 53 |

An insulating layer other than the silicon oxynitride layer may be used as the intermediate layer 12c. For example, another silicon nitride layer having a refractive index lower than that of the silicon nitride layer 12b serving as a lower layer can also be used as the intermediate layer 12c. It is known that silicon nitride films can have various refractive indices depending on the film-forming conditions and the composition, and thus the intermediate layer 12c may be another silicon nitride layer formed by using film-forming conditions and a composition different from those for the silicon nitride layer 12b serving as a lower layer.

When the refractive index $n_C$ of the intermediate layer 12c is excessively close to the refractive index $n_A$ of the silicon oxide layer 12a or the refractive index $n_B$ of the silicon nitride layer 12b, the effect of reducing tinge variation may be insufficient. To sufficiently produce the effect of reducing tinge variation, the refractive index $n_A$ of the silicon oxide layer 12a, the refractive index $n_B$ of the silicon nitride layer 12b, and the refractive index $n_C$ of the intermediate layer 12c preferably satisfy the relation $1.13 \cdot n_A \leq n_C \leq 0.93 \cdot n_B$.

In the example illustrated in FIG. 1, the silicon nitride layer 12b is disposed as a lower layer and the silicon oxide layer 12a is disposed as an upper layer (i.e., between the oxide semiconductor layer 13 and the intermediate layer 12c) in the gate insulating layer 12. The configuration in which the silicon oxide layer 12a is disposed on the upper layer side in contact with the oxide semiconductor layer 13 produces the effect of reducing oxygen deficiency of the oxide semiconductor layer 13.

In the example illustrated in FIG. 1, the silicon oxide layer 20a is disposed as a lower layer and the silicon nitride layer 20b is disposed as an upper layer in the inorganic insulating layer 20. The configuration in which the silicon oxide layer 20a is disposed on the lower layer side in contact with the oxide semiconductor layer 13 produces the effect of reducing oxygen deficiency of the oxide semiconductor layer 13.

As described above, according to the embodiment of the present invention, tinge variation can be reduced during the production of a liquid crystal display panel including an active matrix substrate that includes an oxide semiconductor TFT and a gate insulating layer having a multilayer structure.

While FIG. 1 illustrates the configuration in which the pixel electrode 24 is disposed over the common electrode 22 with the dielectric layer 23 interposed therebetween, conversely, the common electrode 22 may be disposed over the pixel electrode 24 with the dielectric layer 23 interposed therebetween. In this case, at least one slit is formed in the common electrode 22.

While the embodiment has been described in the context of the active matrix substrate 100A for an FFS mode liquid crystal display panel, the embodiment of the present invention is also suitably used for active matrix substrates for liquid crystal display panels in other display modes (e.g., TN (Twisted Nematic) and VA (Vertical Alignment) modes).

[Liquid Crystal Display Panel and Method for Producing Liquid Crystal Display Panel]

Figure 5:
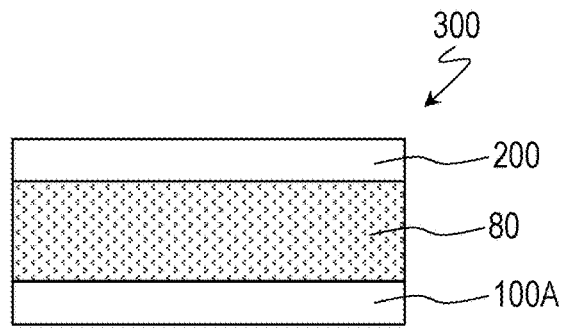
FIG. 5 is a sectional view schematically illustrating a liquid crystal display panel 300 including the active matrix substrate 100A according to the embodiment of the present invention.

FIG. 5 illustrates a liquid crystal display panel 300 including the active matrix substrate 100A according to the embodiment of the present invention. The liquid crystal display panel 300 includes the active matrix substrate 100A, an opposite substrate 200 facing the active matrix substrate 100A, and a liquid crystal layer 80 disposed between the active matrix substrate 100A and the opposite substrate 200, as illustrated in FIG. 5.

The active matrix substrate 100A may be one for the FFS mode as illustrated or may be one for other display mode. The active matrix substrate 100A includes an oxide semiconductor TFT 10 provided in each pixel and the pixel electrode 24. The gate insulating layer 12 of the oxide semiconductor TFT 10 has a multilayer structure including the silicon oxide layer 12a, the silicon nitride layer 12b, and the intermediate layer 12c. The inorganic insulating layer 20 covering the oxide semiconductor TFT 10 has a multilayer structure including the silicon oxide layer 20a and the silicon nitride layer 20b. In the case of an FFS mode, the active matrix substrate 100A further includes the common electrode 22. In the case of a TN mode or a VA mode, the active matrix substrate 100A does not include the common electrode 22.

The opposite substrate 200 typically includes a color filter and a light-shielding layer (black matrix). Thus, the opposite substrate 200 may be referred to as a "color filter substrate". In the case of a TN mode or a VA mode, the opposite substrate 200 includes a counter electrode (common electrode) facing the pixel electrode 24.

An alignment layer is disposed on a surface of the active matrix substrate 100A and a surface of the opposite substrate 200, the surfaces facing the liquid crystal layer 80. In the cases of an FFS mode and a TN mode, a horizontal alignment layer is disposed. In the case of a VA mode, a vertical alignment layer is disposed.

Figure 7:
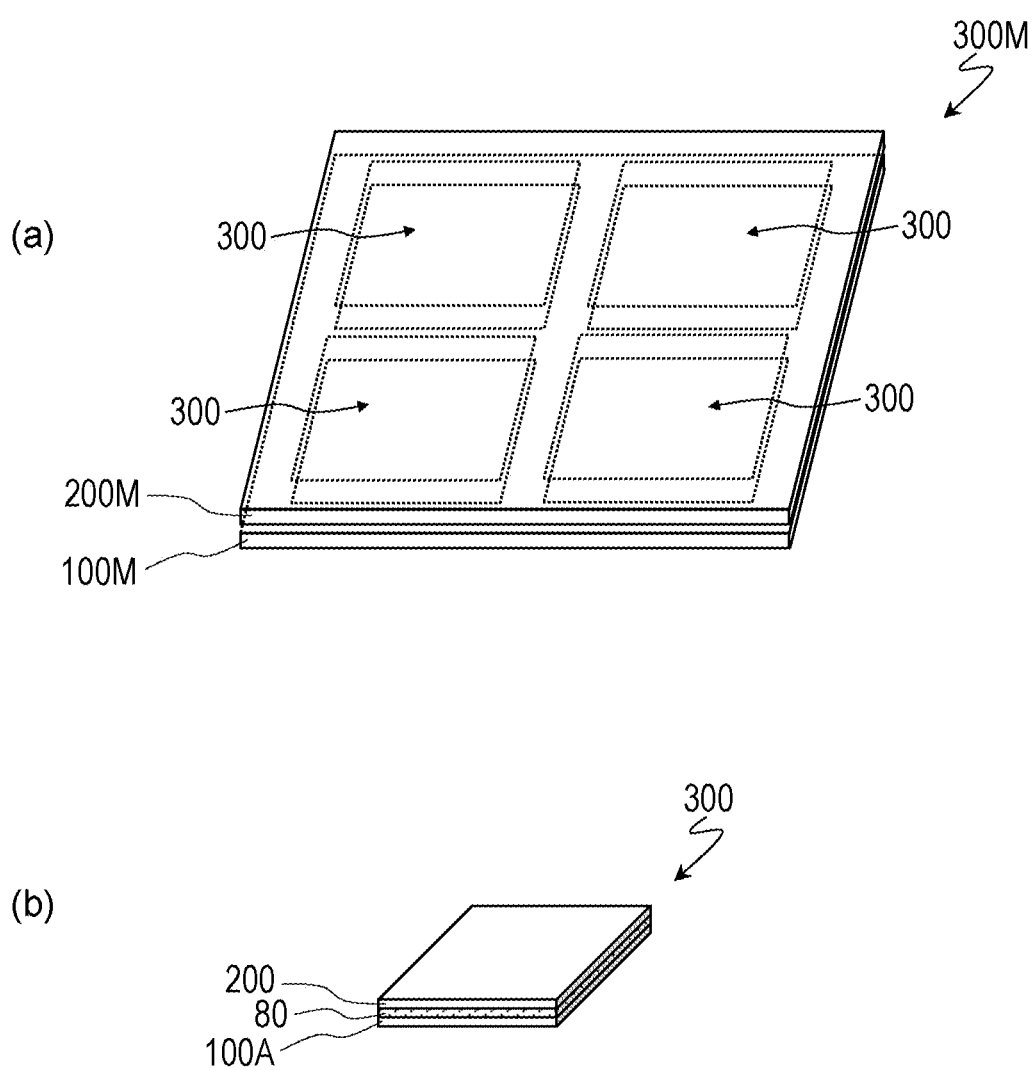
FIGS. 7(a) and 7(b) are perspective views schematically illustrating the process for producing the liquid crystal display panel 300.
Figure 8:
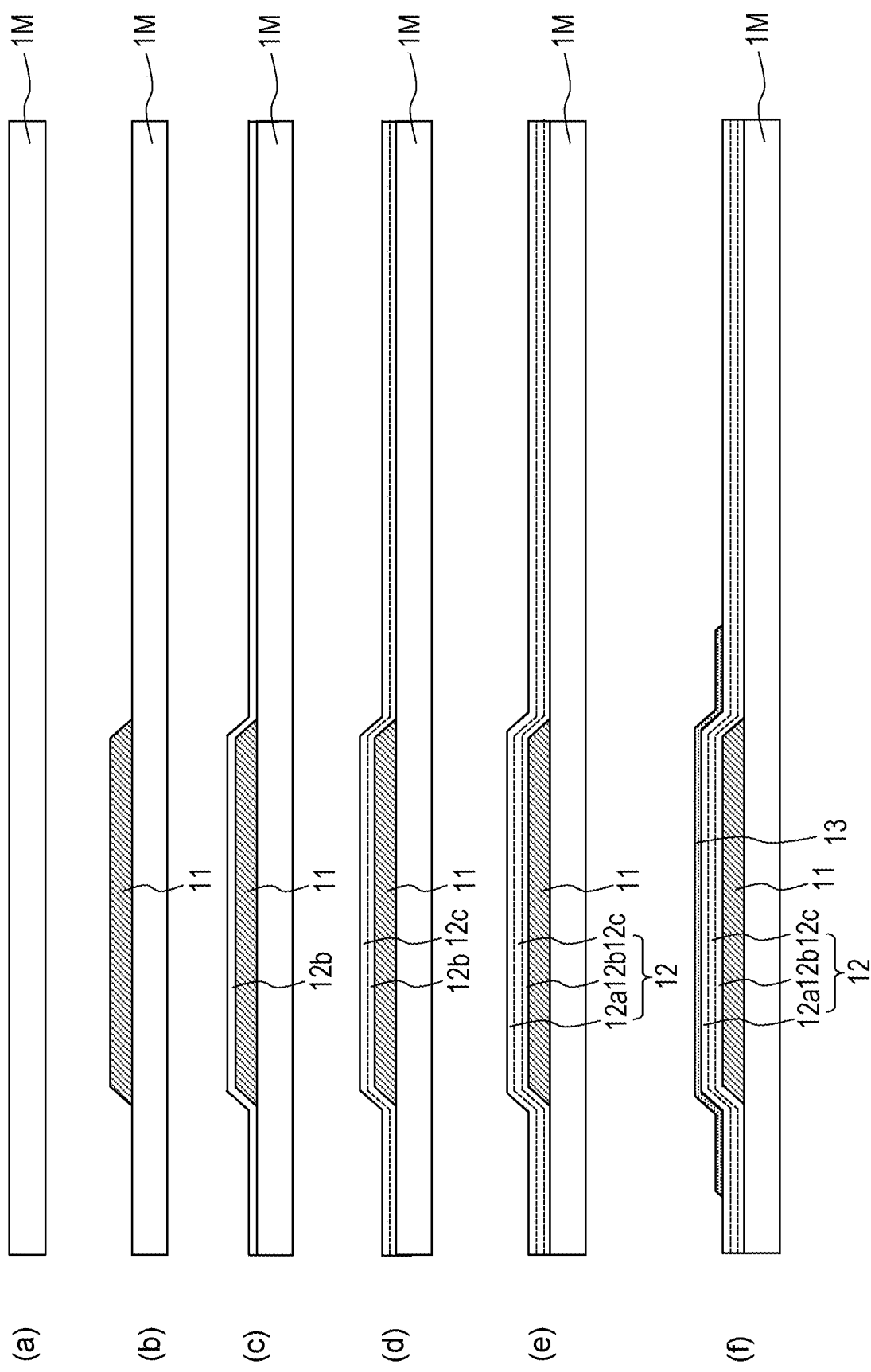
FIGS. 8(a) to 8(f) are sectional views schematically illustrating a process for fabricating a first mother substrate 100M.
Figure 9:
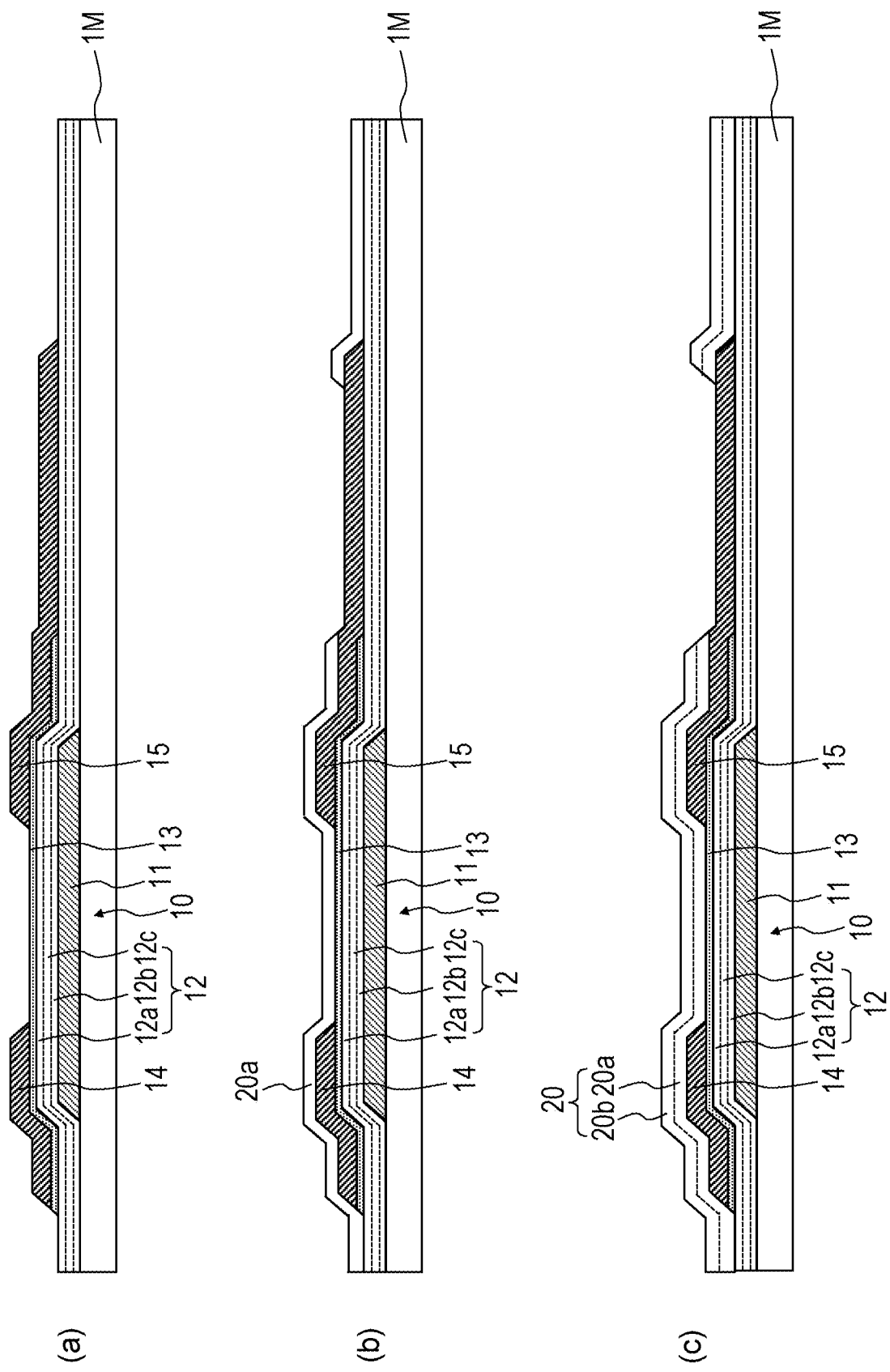
FIGS. 9(a) to 9(c) are sectional views schematically illustrating the process for fabricating the first mother substrate 100M.
Figure 10:
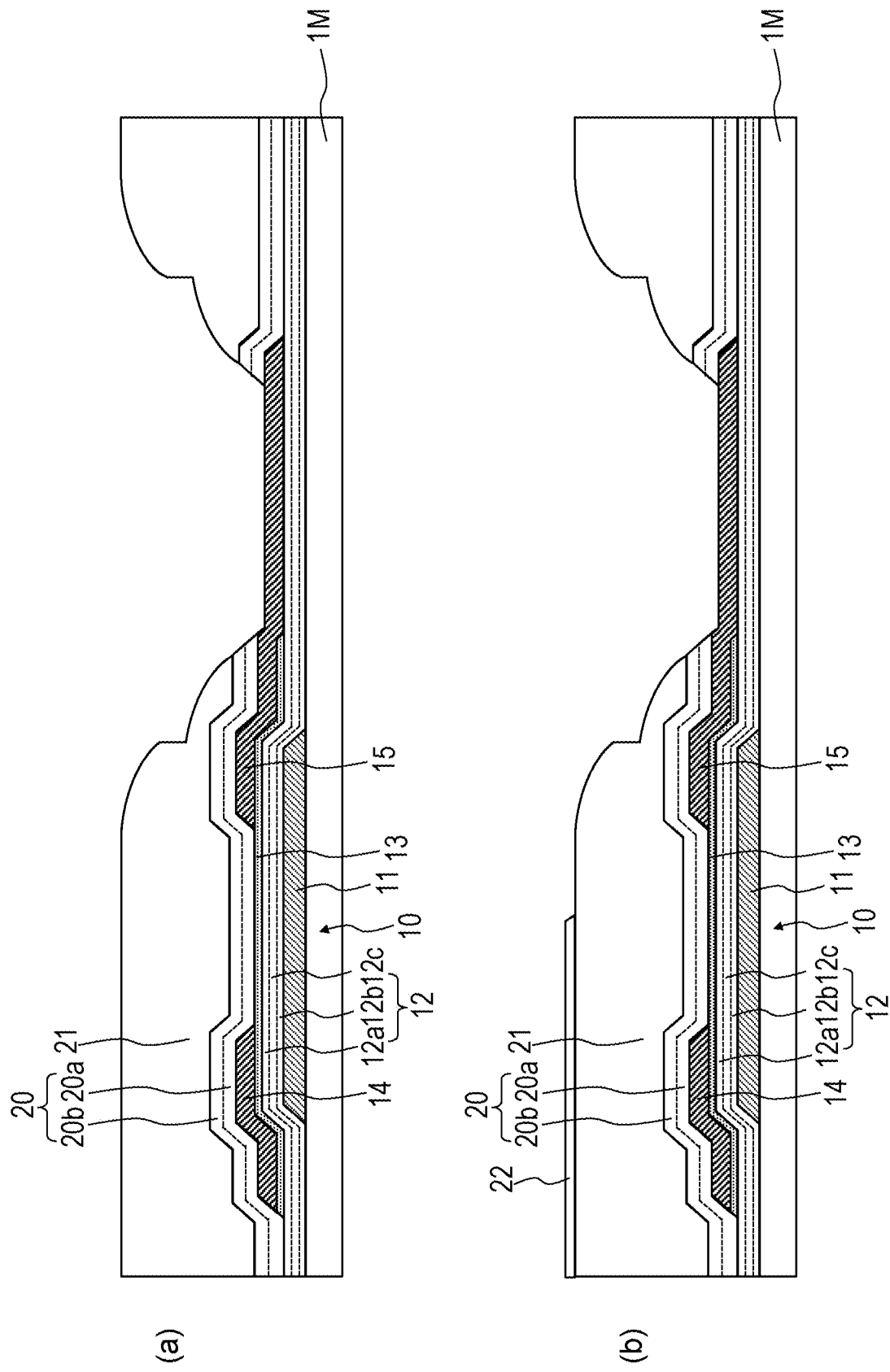
FIGS. 10(a) and 10(b) are sectional views schematically illustrating the process for fabricating the first mother substrate 100M.
Figure 11:
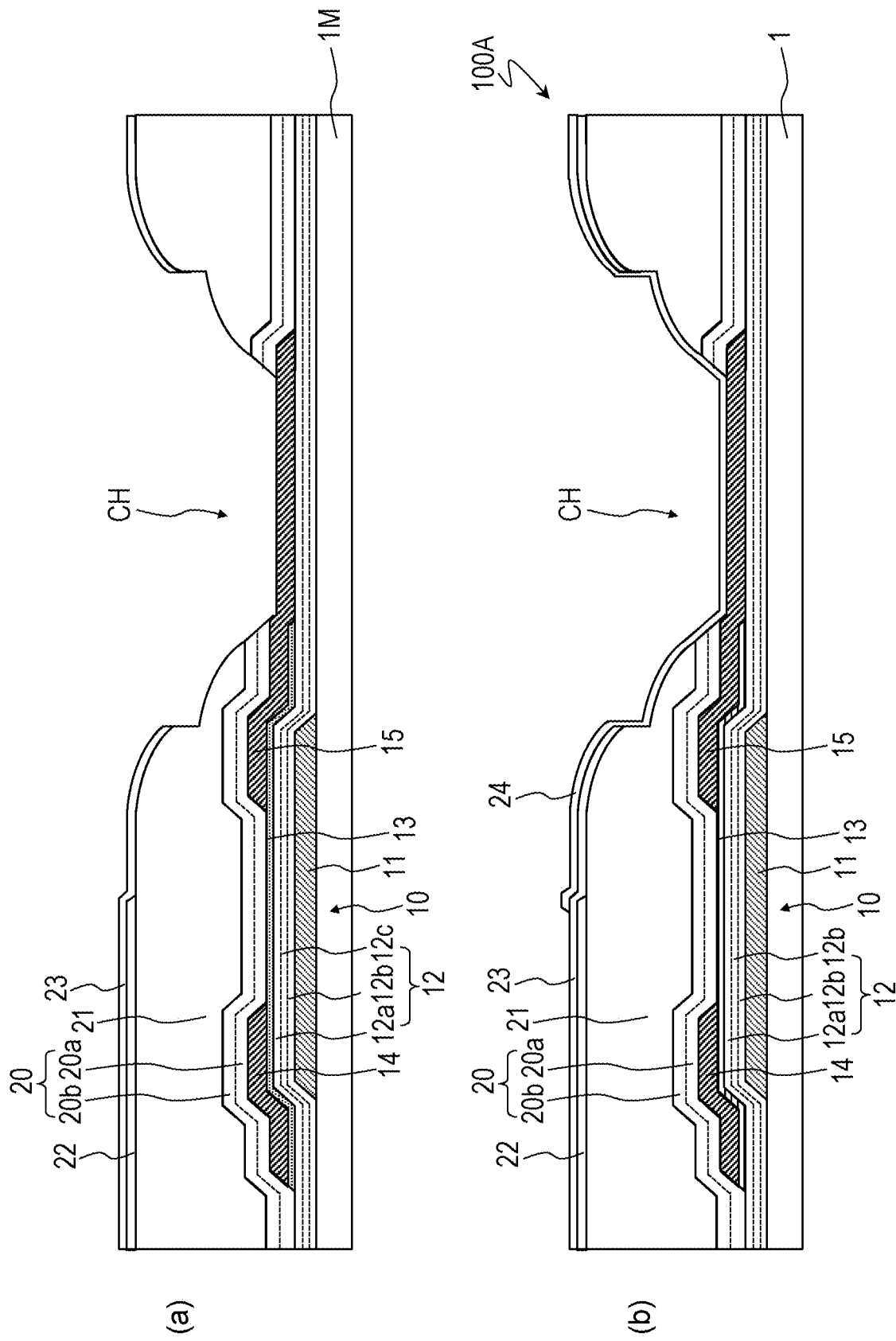
FIGS. 11(a) and 11(b) are sectional views schematically illustrating the process for fabricating the first mother substrate 100M.

A method for producing the liquid crystal display panel 300 will be described with reference to FIG. 6 and FIG. 7.

First, a mother substrate (hereinafter referred to as a "first mother substrate") 100M including a plurality of the active matrix substrates 100A is prepared, as illustrated in FIG. 6(a). A method for preparing (fabricating) the first mother substrate 100M will be described later.

Separately from the preparation of the first mother substrate 100M, a mother substrate (hereinafter referred to as a "second mother substrate") 200M including a plurality of the opposite substrates 200 is prepared, as illustrated in FIG. 6(b). The opposite substrates 200 can be fabricated by any known method for fabricating a color filter substrate.

Next, the first mother substrate 100M and the second mother substrate 200M are laminated together to fabricate a mother panel 300M including a plurality of the liquid crystal display panels 300, as illustrated in FIG. 7(a). The first mother substrate 100M and the second mother substrate 200M are bonded and fixed together with a sealing portion (not illustrated) formed so as to surround display areas of the liquid crystal display panels 300.

Thereafter, the mother panel 300M are divided to obtain the liquid crystal display panel 300, as illustrated in FIG. 7(b). The liquid crystal layer 80 between the active matrix substrate 100A and the opposite substrate 200 can be formed by dropping or vacuum injection.

Subsequently, a method for fabricating (preparing) the first mother substrate 100M will be described with reference to FIG. 8, FIG. 9, FIG. 10, and FIG. 11.

First, an insulating substrate 1M sized to include a plurality of the substrates 1 is provided, as illustrated in FIG. 8(a).

Next, the gate electrode 11 is formed on the insulating substrate 1M at each area corresponding to the substrate 1, as illustrated in FIG. 8(b). At this time, a scan line is simultaneously formed. For example, the gate electrode 11 and the scan line can be formed by depositing a conductive film on the insulating substrate 1M and patterning the conductive film into a desired shape by a photolithography process. The gate electrode 11 and the scan line each have, for example, a multilayer structure in which a TaN layer having a thickness of 30 nm and a W layer having a thickness of 300 nm are stacked in this order.

Subsequently, the gate insulating layer 12 covering the gate electrode 11 and the scan line is formed. Specifically, first, the silicon nitride layer 12b covering the gate electrode 11 and the scan line is formed, for example, by CVD, as illustrated in FIG. 8(c). The thickness of the silicon nitride layer 12b is, for example, 200 nm or more and 400 nm or less. Subsequently, the intermediate layer 12c (in this case, a silicon oxynitride layer) is formed on the silicon nitride layer 12b, for example, by CVD, as illustrated in FIG. 8(d). The thickness of the silicon oxynitride layer 12c is, for example, 10 nm or more and 100 nm or less. Thereafter, the silicon oxide layer 12a is formed on the silicon oxynitride layer 12c, for example, by CVD, as illustrated in FIG. 8(e). The thickness of the silicon oxide layer 12a is, for example, 10 nm or more and 100 nm or less.

Next, on the gate insulating layer 12 is formed the oxide semiconductor layer 13 facing the gate electrode 11 with the gate insulating layer 12 interposed therebetween, as illustrated in FIG. 8(f). For example, the oxide semiconductor layer 13 is formed by depositing an oxide semiconductor film on the gate insulating layer 12 and patterning the oxide semiconductor film into a desired shape by a photolithography process. The oxide semiconductor layer 13 is, for example, an In—Ga—Zn—O-based semiconductor layer having a thickness of 50 nm.

Subsequently, the source electrode 14 and the drain electrode 15 each electrically connected to the oxide semiconductor layer 13 are formed, as illustrated in FIG. 9(a). At this time, a signal line is simultaneously formed. For example, the source electrode 14, the drain electrode 15, and the signal line can be formed by depositing a conductive film on the oxide semiconductor layer 13 and the gate insulating layer 12 and patterning the conductive film into a desired shape by a photolithography process. The source electrode 14, the drain electrode 15, and the signal line each have, for example, a multilayer structure in which a Ti layer having a thickness of 30 nm, an Al layer having a thickness of 200 nm, and a Ti layer having a thickness of 100 nm are stacked in this order.

Next, the inorganic insulating layer 20 covering the oxide semiconductor layer 13, the source electrode 14, the drain electrode 15, and the signal line is formed. Specifically, first, the silicon oxide layer 20a covering the oxide semiconductor layer 13 and others is formed, for example, by CVD, as illustrated in FIG. 9(b). The thickness of the silicon oxide layer 20a is, for example, 150 nm or more and 400 nm or less. Thereafter, the silicon nitride layer 20b is formed on the silicon oxide layer 20a, for example, by CVD, as illustrated in FIG. 9(c). The thickness of the silicon nitride layer 20b is, for example, 30 nm or more and 250 nm or less. An opening is formed in an area of the inorganic insulating layer 20 where the contact hole CH will be formed later.

Next, the organic insulating layer 21 is formed on the inorganic insulating layer 20, as illustrated in FIG. 10(a). The organic insulating layer 21 is formed of, for example, a photosensitive resin material. An opening is formed in an area of the organic insulating layer 21 where the contact hole CH will be formed later.

Subsequently, the common electrode 22 is formed on the organic insulating layer 21, as illustrated in FIG. 10(b). For example, the common electrode 22 can be formed by depositing a transparent conductive film on the organic insulating layer 21 and patterning the transparent conductive film into a desired shape by a photolithography process. The common electrode 22 is, for example, an IZO layer having a thickness of 100 nm.

Next, the dielectric layer 23 is formed so as to cover the common electrode 22, as illustrated in FIG. 11(a). The dielectric layer 23 is, for example, a silicon nitride layer having a thickness of 100 nm. An opening is formed in an area of the dielectric layer 23 where the contact hole CH will be formed.

Subsequently, the pixel electrode 24 is formed on the dielectric layer 23, as illustrated in FIG. 11(b). For example, the pixel electrode 24 is formed by depositing a transparent conductive film on the dielectric layer 23 and patterning the transparent conductive film into a desired shape by a photolithography process. The pixel electrode 24 is, for example, an IZO layer having a thickness of 100 nm. Thereafter, an alignment layer is formed all over so as to cover the pixel electrode 24 to thereby obtain the active matrix substrate 100A.

According to the embodiment of the present invention, tinge variation due to a difference in interference color can be reduced. Thus, according to the embodiment of the present invention, the quality of a liquid crystal display panel can be improved, and at the same time, upsizing of a mother substrate can be promoted.

Embodiment 2

Figure 12:
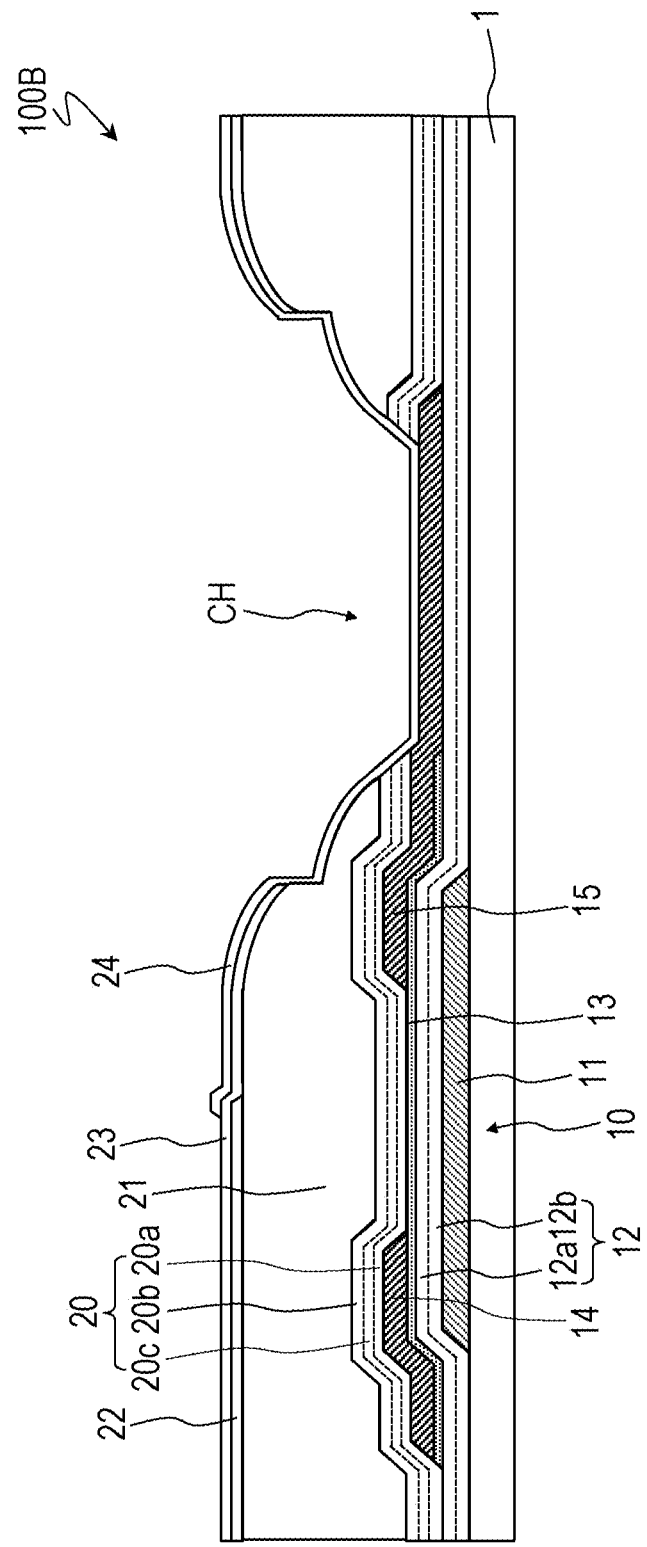
FIG. 12 is a sectional view schematically illustrating an active matrix substrate 100B according to an embodiment of the present invention.

An active matrix substrate 100B according to this embodiment will be described with reference to FIG. 12. FIG. 12 is a sectional view schematically illustrating the active matrix substrate 100B. Hereinafter, how the active matrix substrate 100B differs from the active matrix substrate 100A according to embodiment 1 will be mainly described (the same shall apply in the following embodiments).

A gate insulating layer 12 of the active matrix substrate 100B has a multilayer structure including a silicon oxide (SiOx) layer 12a and a silicon nitride (SiNx) layer 12b. An inorganic insulating layer 20 of the active matrix substrate 100B has a multilayer structure including a silicon oxide (SiOx) layer 20a and a silicon nitride (SiNx) layer 20b.

In this embodiment, the inorganic insulating layer 20 further includes an intermediate layer 20c disposed between the silicon oxide layer 20a and the silicon nitride layer 20b, as illustrated in FIG. 12. The intermediate layer 20c has a refractive index $n_C$ higher than a refractive index $n_A$ of the silicon oxide layer 20a and lower than a refractive index $n_B$ of the silicon nitride layer 20b.

The presence of the above-described intermediate layer 20c in the inorganic insulating layer 20 reduces the likelihood of the occurrence of optical interference due to the multilayer structure of the inorganic insulating layer 20. Thus, tinge variation is reduced.

As the intermediate layer 20c, a silicon oxynitride (SiOxNy: x may be greater than or equal to y, or x may be less than y) layer can be suitably used for the same reason as described for the intermediate layer 12c of the gate insulating layer 12. To sufficiently produce the effect of reducing tinge variation, the refractive index $n_A$ of the silicon oxide layer 20a, the refractive index $n_B$ of the silicon nitride layer 20b, and the refractive index $n_C$ of the intermediate layer 20c preferably satisfy the relation $1.13 \cdot n_A \leq n_C \leq 0.93 \cdot n_B$.

Embodiment 3

Figure 13:
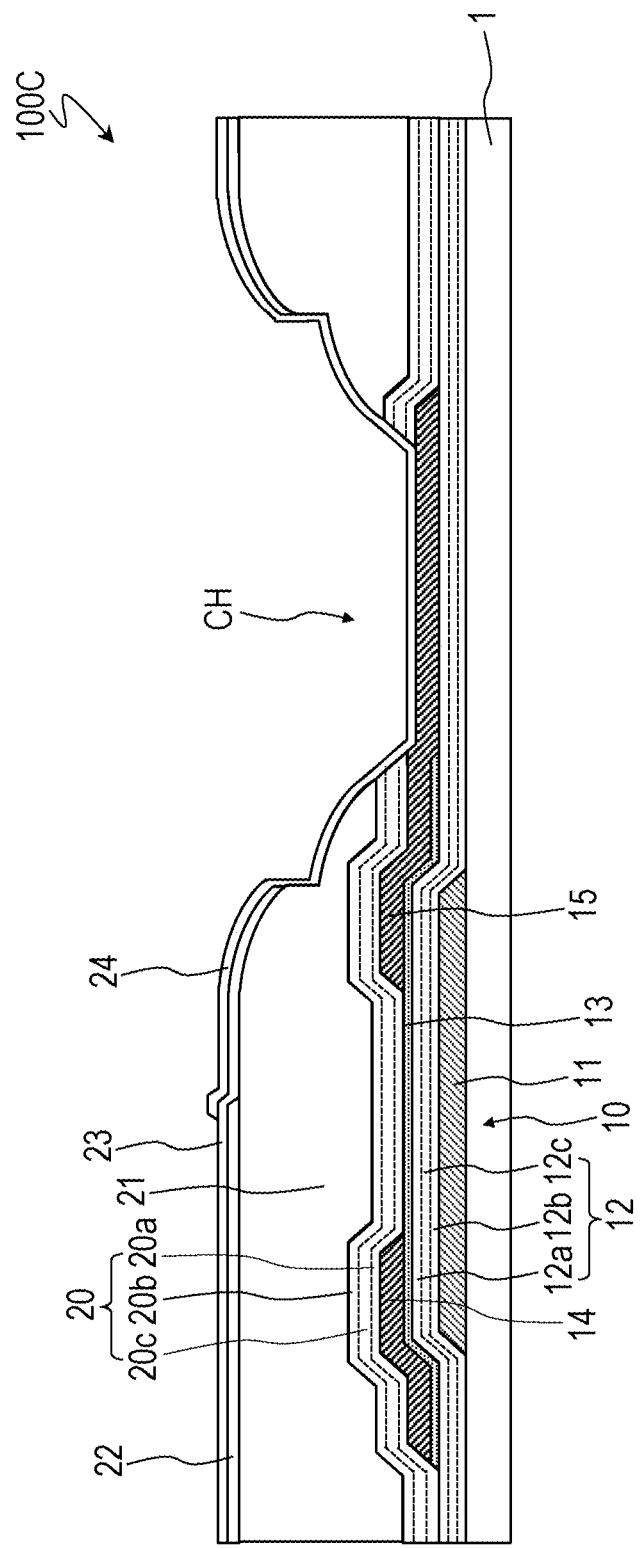
FIG. 13 is a sectional view schematically illustrating an active matrix substrate 100C according to an embodiment of the present invention.

An active matrix substrate 100C according to this embodiment will be described with reference to FIG. 13. FIG. 13 is a sectional view schematically illustrating the active matrix substrate 100C.

A gate insulating layer 12 of the active matrix substrate 100C has a multilayer structure including a silicon oxide (SiOx) layer 12a and a silicon nitride (SiNx) layer 12b. An inorganic insulating layer 20 of the active matrix substrate 100C has a multilayer structure including a silicon oxide (SiOx) layer 20a and a silicon nitride (SiNx) layer 20b.

In this embodiment, the gate insulating layer 12 further includes an intermediate layer 12c disposed between the silicon oxide layer 12a and the silicon nitride layer 12b, as illustrated in FIG. 13. The intermediate layer 12c has a refractive index $n_C$ higher than a refractive index $n_A$ of the silicon oxide layer 12a and lower than a refractive index $n_B$ of the silicon nitride layer 12b. The inorganic insulating layer 20 further includes an intermediate layer 20c disposed between the silicon oxide layer 20a and the silicon nitride layer 20b. The intermediate layer 20c has a refractive index $n_C$ higher than a refractive index $n_A$ of the silicon oxide layer 20a and lower than a refractive index $n_B$ of the silicon nitride layer 20b.

As described above, in this embodiment, the gate insulating layer 12 has a multilayer structure including the intermediate layer 12c, and the inorganic insulating layer 20 has a multilayer structure including the intermediate layer 20c. Thus, optical interference due to the multilayer structure of the gate insulating layer 12 and optical interference due to the multilayer structure of the inorganic insulating layer 20 are less likely to occur.

Thus, tinge variation is further reduced.

Embodiment 4

Figure 14:
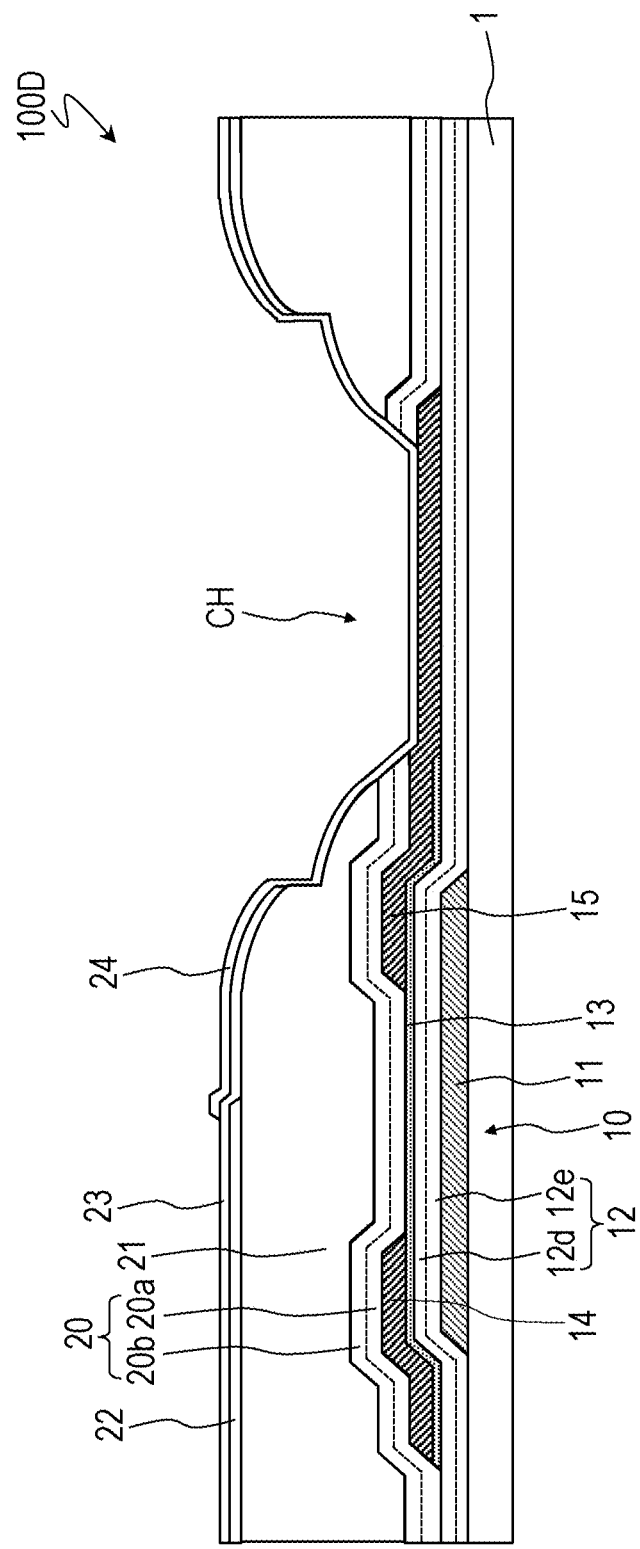
FIG. 14 is a sectional view schematically illustrating an active matrix substrate 100D according to an embodiment of the present invention.

An active matrix substrate 100D according to this embodiment will be described with reference to FIG. 14. FIG. 14 is a sectional view schematically illustrating the active matrix substrate 100D.

A gate insulating layer 12 of the active matrix substrate 100D is an insulating layer stack having a multilayer structure including a first layer 12d and a second layer 12e, as illustrated in FIG. 14. The first layer 12d is a silicon oxide (SiOx) layer. The second layer 12e has a refractive index $n_E$ different from a refractive index $n_D$ of the first layer 12d. In the example illustrated in FIG. 14, the second layer 12e is disposed as a lower layer, and the first layer 12d is disposed as an upper layer (i.e., between an oxide semiconductor layer 13 and the second layer 12e).

In this embodiment, the difference between the refractive index $n_D$ of the first layer 12d and the refractive index $n_E$ of the second layer 12e is 0.33 or less. This reduces the likelihood of the occurrence of optical interference due to the multilayer structure of the gate insulating layer 12, thus reducing tinge variation.

Figure 15:
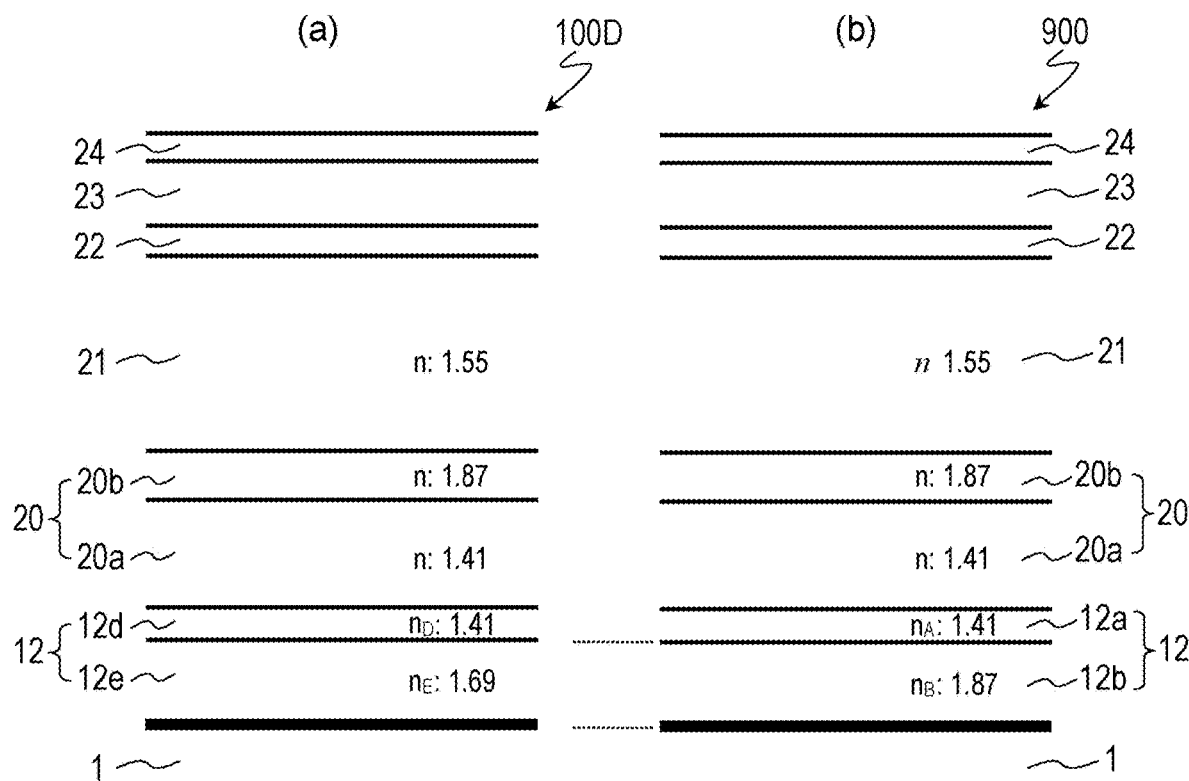
FIG. 15(a) schematically illustrates a multilayer structure of the active matrix substrate 100D, and FIG. 15(b) schematically illustrates a multilayer structure of an active matrix substrate 900 of Comparative Example.

FIG. 15(a) schematically illustrates a multilayer structure of the active matrix substrate 100D according to this embodiment, and FIG. 15(b) schematically illustrates a multilayer structure of the active matrix substrate 900 of Comparative Example. Examples of refractive indices of the insulating layers are also shown in FIGS. 15(a) and 15(b).

In the example illustrated in FIG. 15(a), the gate insulating layer 12 of the active matrix substrate 100D includes the first layer (silicon oxide layer) 12d having a refractive index $n_D$ of 1.41 and the second layer 12e having a refractive index $n_E$ of 1.69. By contrast, in the example illustrated in FIG. 15(b), the gate insulating layer 12 of the active matrix substrate 900 of Comparative Example includes the silicon oxide layer 12a having a refractive index $n_A$ of 1.41 and the silicon nitride layer 12b having a refractive index $n_B$ of 1.87. In both the examples in FIGS. 15(a) and 15(b), the refractive indices n of the silicon oxide layer 20a and the silicon nitride layer 20b of the inorganic insulating layer 20 and the refractive index n of the organic insulating layer 21 are 1.41, 1.87, and 1.55, respectively.

Figure 16:
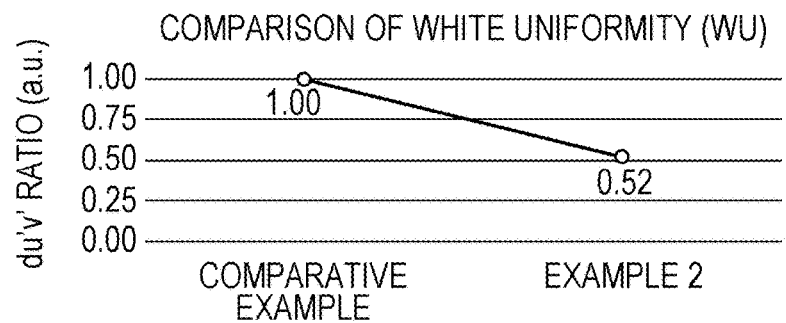
FIG. 16 is a graph showing the result of a comparison between a mother substrate of Example 2 and a mother substrate of Comparative Example in terms of white uniformity (WU) in planes of the mother substrates.

FIG. 16 shows the result of a comparison between a mother substrate including insulating layers having refractive indices set as in the example illustrated in FIG. 15(a) (Example 2) and a mother substrate including insulating layers having refractive indices set as in the example illustrated in FIG. 15(b) (Comparative Example) in terms of white uniformity (WU) in planes of the mother substrates. In FIG. 16, tinge variations (du'v') of Comparative Example and Example 2 are expressed as relative ratios (Comparative Example: 1.00). The thickness of each insulating layer of Comparative Example was set to be the same as the thickness of the corresponding layer of Example 2 (the thicknesses of the first layer 12d and the second layer 12e of the gate insulating layer 12 of Example 2 were set to be the same as the thicknesses of the silicon oxide layer 12a and the silicon nitride layer 12b of the gate insulating layer 12 of Comparative Example).

It can be seen from FIG. 16 that in Example 2, the white uniformity is about twice as high as (the tinge variation is about half as small as) that of Comparative Example.

As the second layer 12e, for example, a silicon oxynitride (SiOxNy: x may be greater than or equal to y, or x may be less than y) layer can be suitably used. The refractive index of silicon oxynitride decreases (i.e., becomes closer to the refractive index of silicon oxide) as the oxygen content increases and increases (i.e., becomes closer to the refractive index of silicon nitride) as the nitrogen content increases. Thus, by using a silicon oxynitride layer as the second layer 12e, the desired refractive index $n_E$ differing from the refractive index $n_D$ of the first layer 12d by 0.33 or less can be readily achieved. In addition, by using a silicon oxynitride layer as the second layer 12e, the second layer 12e is readily formed. An insulating layer other than the silicon oxynitride layer may be used as the second layer 12e.

To further reduce tinge variation, the difference between the refractive index $n_D$ of the first layer 12d and the refractive index $n_E$ of the second layer 12e is more preferably 0.28 or less.

In the example illustrated in FIG. 14, the second layer 12e is disposed as a lower layer, and the first layer 12d is disposed as an upper layer (i.e., between the oxide semiconductor layer 13 and the second layer 12e). The configuration in which the first layer (silicon oxide layer) 12d is disposed on the upper layer side in contact with the oxide semiconductor layer 13 produces the effect of reducing oxygen deficiency of the oxide semiconductor layer 13.

Embodiment 5

Figure 17:
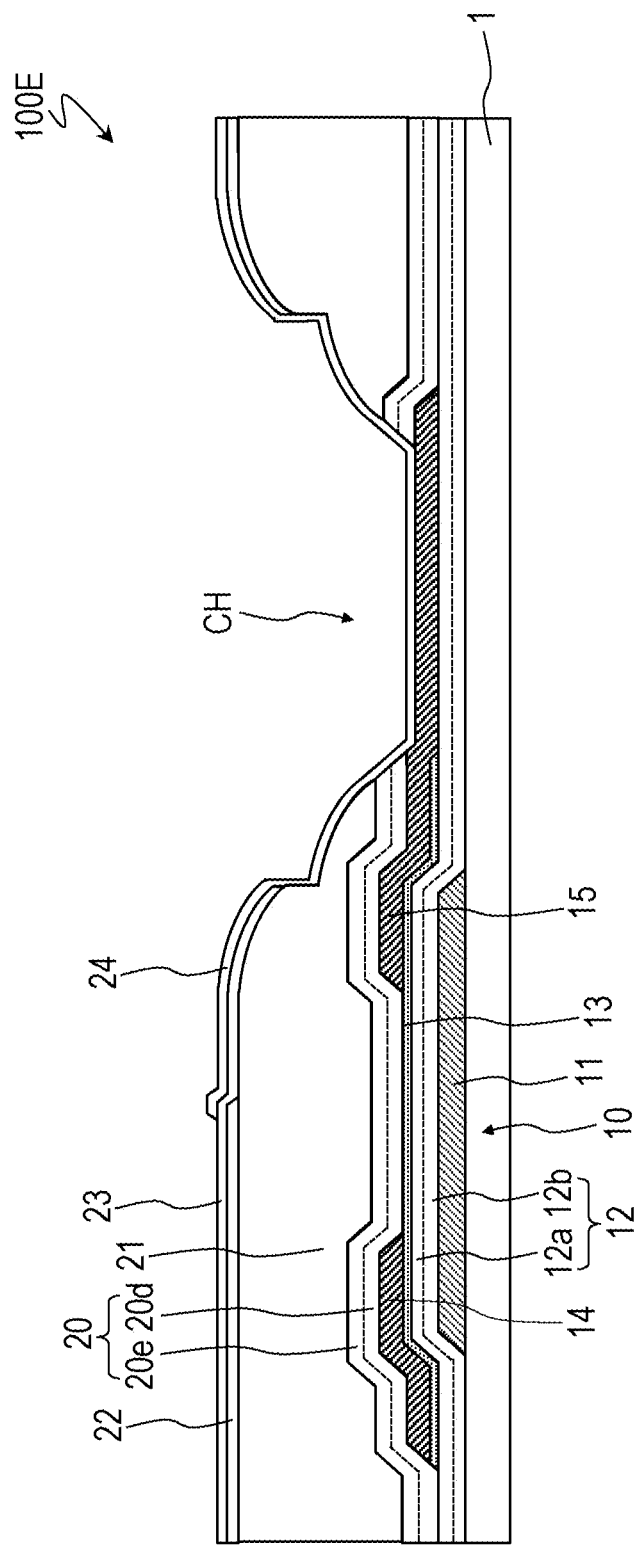
FIG. 17 is a sectional view schematically illustrating an active matrix substrate 100E according to an embodiment of the present invention.

An active matrix substrate 100E according to this embodiment will be described with reference to FIG. 17. FIG. 17 is a sectional view schematically illustrating the active matrix substrate 100E.

An inorganic insulating layer 20 of the active matrix substrate 100E is an insulating layer stack having a multilayer structure including a first layer 20d and a second layer 20e, as illustrated in FIG. 17. The first layer 20d is a silicon oxide (SiOx) layer. The second layer 20e has a refractive index $n_E$ different from a refractive index $n_D$ of the first layer 20d. In the example illustrated in FIG. 17, the second layer 20e is disposed as an upper layer, and the first layer 20d is disposed as a lower layer (i.e., between an oxide semiconductor layer 13 and the second layer 20e).

In this embodiment, the difference between the refractive index $n_D$ of the first layer 20d and the refractive index $n_E$ of the second layer 20e is 0.33 or less. This reduces the likelihood of the occurrence of optical interference due to the multilayer structure of the inorganic insulating layer 20, thus reducing tinge variation.

As the second layer 20e, a silicon oxynitride (SiOxNy: x may be greater than or equal to y, or x may be less than y) layer can be suitably used for the same reason as described for the second layer 12e of the gate insulating layer 12. To further reduce tinge variation, the difference between the refractive index $n_D$ of the first layer 20d and the refractive index $n_E$ of the second layer 20e is more preferably 0.28 or less.

Embodiment 6

Figure 18:
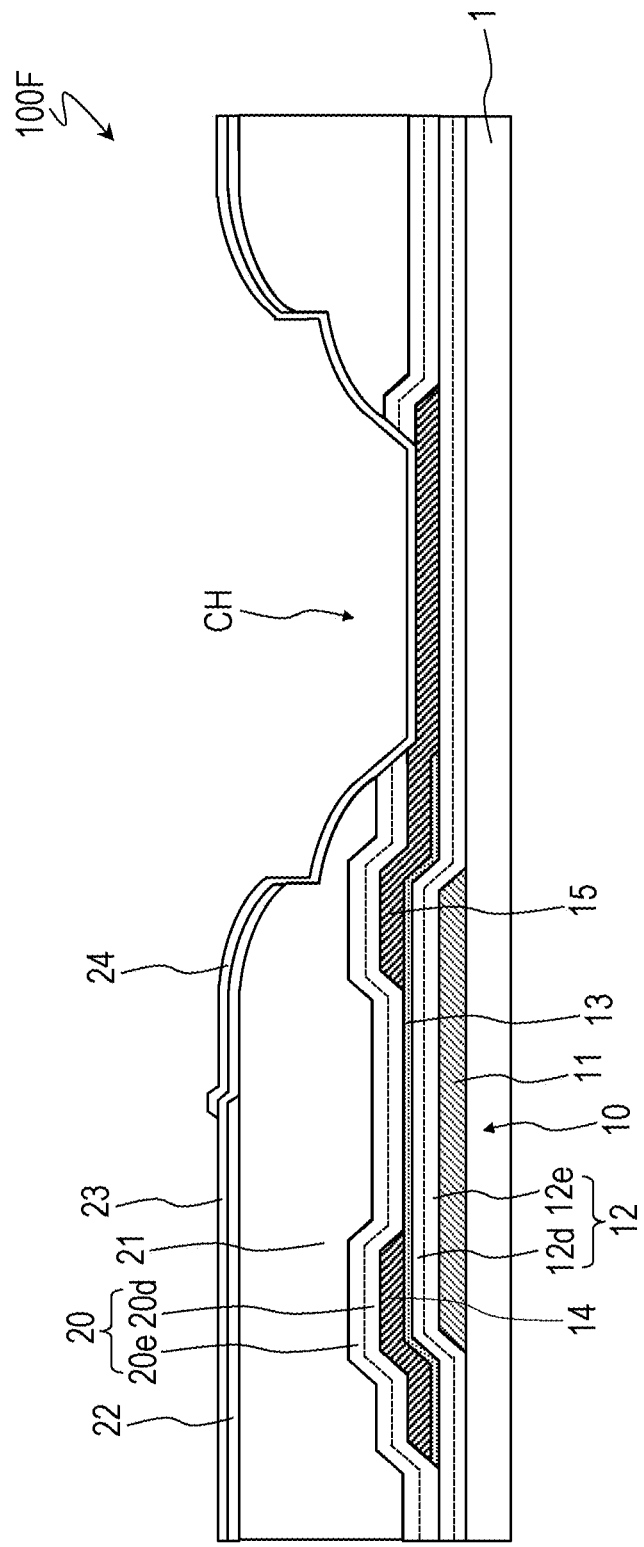
FIG. 18 is a sectional view schematically illustrating an active matrix substrate 100F according to an embodiment of the present invention.

An active matrix substrate 100F according to this embodiment will be described with reference to FIG. 18. FIG. 18 is a sectional view schematically illustrating the active matrix substrate 100F.

A gate insulating layer 12 of the active matrix substrate 100F is an insulating layer stack having a multilayer structure including a first layer 12d and a second layer 12e, as illustrated in FIG. 18. The first layer 12d is a silicon oxide (SiOx) layer. The second layer 12e has a refractive index $n_E$ different from a refractive index $n_D$ of the first layer 12d. In the example illustrated in FIG. 18, the second layer 12e is disposed as a lower layer, and the first layer 12d is disposed as an upper layer (i.e., between an oxide semiconductor layer 13 and the second layer 12e).

An inorganic insulating layer 20 of the active matrix substrate 100F is an insulating layer stack having a multilayer structure including a first layer 20d and a second layer 20e, as illustrated in FIG. 18. The first layer 20d is a silicon oxide (SiOx) layer. The second layer 20e has a refractive index $n_E$ different from a refractive index $n_D$ of the first layer 20d. In the example illustrated in FIG. 18, the second layer 20e is disposed as an upper layer, and the first layer 20d is disposed as a lower layer (i.e., between the oxide semiconductor layer 13 and the second layer 20e).

In this embodiment, the difference between the refractive index $n_D$ of the first layer 12d of the gate insulating layer 12 and the refractive index $n_E$ of the second layer 12e is 0.33 or less, and the difference between the refractive index $n_D$ of the first layer 20d of the inorganic insulating layer 20 and the refractive index $n_E$ of the second layer 20e is 0.33 or less. This reduces the likelihood of the occurrence of optical interference due to the multilayer structure of the gate insulating layer 12 and optical interference due to the multilayer structure of the inorganic insulating layer 20, thus further reducing tinge variation.

Figure 19:
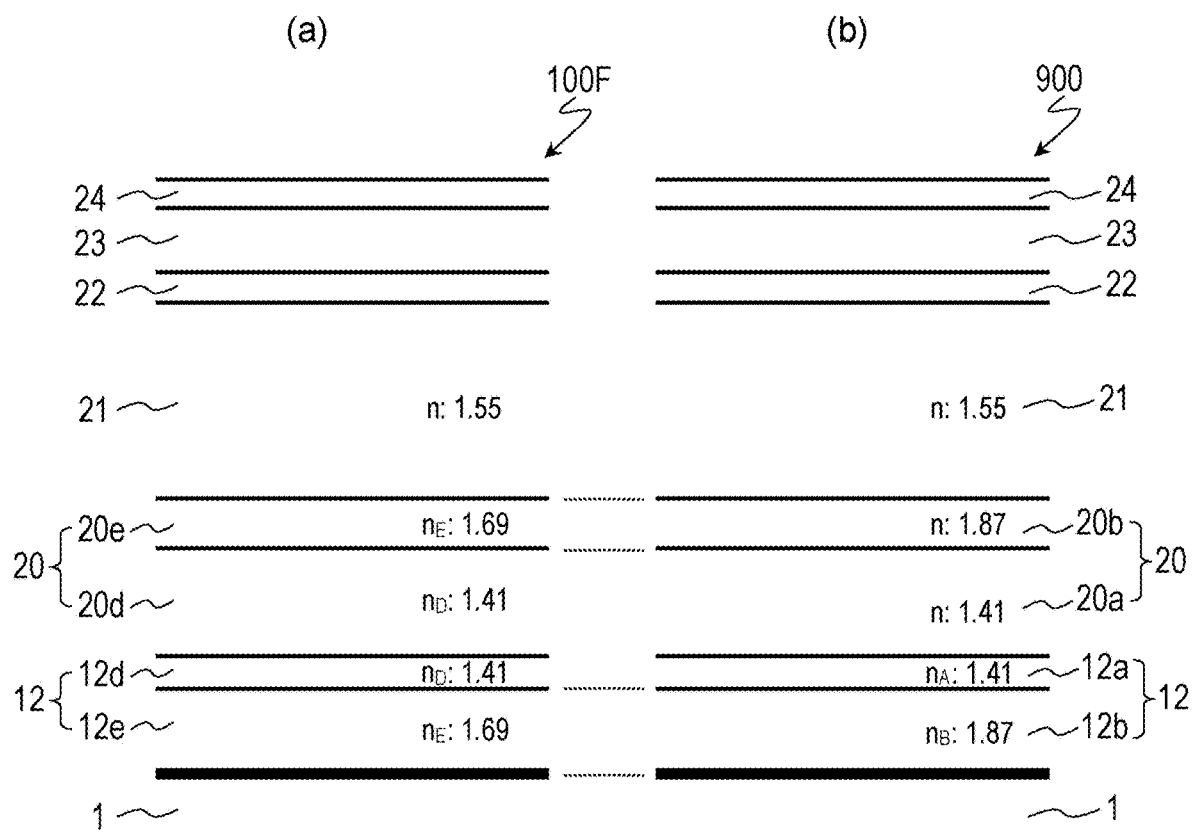
FIG. 19(a) schematically illustrates a multilayer structure of the active matrix substrate 100F, and FIG. 19(b) schematically illustrates a multilayer structure of an active matrix substrate 900 of Comparative Example.

FIG. 19(a) schematically illustrates a multilayer structure of the active matrix substrate 100F according to this embodiment, and FIG. 19(b) schematically illustrates a multilayer structure of the active matrix substrate 900 of Comparative Example. Examples of refractive indices of the insulating layers are also shown in FIGS. 19(a) and 19(b).

In the example illustrated in FIG. 19(a), the gate insulating layer 12 of the active matrix substrate 100F includes the first layer (silicon oxide layer) 12d having a refractive index $n_D$ of 1.41 and the second layer 12e having a refractive index $n_E$ of 1.69. By contrast, in the example illustrated in FIG. 19(b), the gate insulating layer 12 of the active matrix substrate 900 of Comparative Example includes the silicon oxide layer 12a having a refractive index $n_A$ of 1.41 and the silicon nitride layer 12b having a refractive index $n_B$ of 1.87.

In the example illustrated in FIG. 19(a), the inorganic insulating layer 20 of the active matrix substrate 100F includes the first layer (silicon oxide layer) 20d having a refractive index $n_D$ of 1.41 and the second layer 20e having a refractive index $n_E$ of 1.69. By contrast, in the example illustrated in FIG. 19(b), the inorganic insulating layer 20 of the active matrix substrate 900 of Comparative Example includes the silicon oxide layer 20a having a refractive index $n_A$ of 1.41 and the silicon nitride layer 20b having a refractive index n of 1.87.

In both the examples in FIGS. 19(a) and 19(b), the refractive index n of the organic insulating layer 21 is 1.55.

Figure 20:
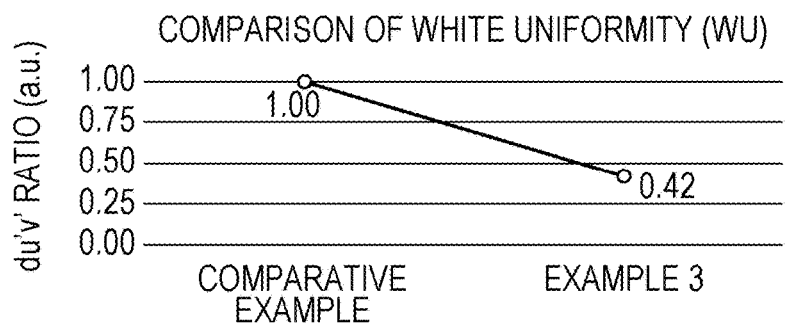
FIG. 20 is a graph showing the result of a comparison between a mother substrate of Example 3 and a mother substrate of Comparative Example in terms of white uniformity (WU) in planes of the mother substrates.

FIG. 20 shows the result of a comparison between a mother substrate including insulating layers having refractive indices set as in the example illustrated in FIG. 19(a) (Example 3) and a mother substrate including insulating layers having refractive indices set as in the example illustrated in FIG. 19(b) (Comparative Example) in terms of white uniformity (WU) in planes of the mother substrates. In FIG. 20, tinge variations (du'v') of Comparative Example and Example 3 are expressed as relative ratios (Comparative Example: 1.00). The thickness of each insulating layer of Comparative Example was set to be the same as the thickness of the corresponding layer of Example 3. The thicknesses of the first layer 12d and the second layer 12e of the gate insulating layer 12 of Example 3 were set to be the same as the thicknesses of the silicon oxide layer 12a and the silicon nitride layer 12b of the gate insulating layer 12 of Comparative Example, and the thicknesses of the first layer 20d and the second layer 20e of the inorganic insulating layer 20 of Example 3 were set to be the same as the thicknesses of the silicon oxide layer 20a and the silicon nitride layer 20b of the inorganic insulating layer 20 of Comparative Example.

It can be seen from FIG. 20 that in Example 3, the white uniformity is about twice as high as (the tinge variation is about half as small as) that of Comparative Example.

While the TFT 10 having a bottom-gate structure has been described in the above embodiments 1 to 6, the embodiments of the present invention can be suitably used also for an active matrix substrate including a TFT having a top-gate structure.

[Regarding Oxide Semiconductor]

The oxide semiconductor contained in the oxide semiconductor layer 13 may be an amorphous oxide semiconductor or a crystalline oxide semiconductor having a crystalline portion. Examples of such crystalline oxide semiconductors include polycrystalline oxide semiconductors, microcrystal oxide semiconductors, and crystalline oxide semiconductors whose c axis is oriented substantially perpendicularly to their layer plane.

The oxide semiconductor layer 13 may have a multilayer structure including two or more layers. When the oxide semiconductor layer 13 has a multilayer structure, the oxide semiconductor layer 13 may include an amorphous oxide semiconductor layer and a crystalline oxide semiconductor layer. Alternatively, the oxide semiconductor layer 13 may include a plurality of crystalline oxide semiconductor layers of different crystal structures. The oxide semiconductor layer 13 may also include a plurality of amorphous oxide semiconductor layers. When the oxide semiconductor layer 13 has a two-layer structure including an upper layer and a lower layer, the energy gap of an oxide semiconductor contained in the upper layer is preferably larger than the energy gap of an oxide semiconductor contained in the lower layer. In cases where these layers have a relatively small difference in energy gap, the energy gap of the oxide semiconductor of the lower layer may be larger than the energy gap of the oxide semiconductor of the upper layer.

Materials and structures of amorphous oxide semiconductors and the crystalline oxide semiconductors described above, methods of forming these semiconductors into films, configurations of oxide semiconductor layers having multilayer structures, etc. are disclosed, for example, in Japanese Unexamined Patent Application Publication No. 2014-007399. The entire contents of Japanese Unexamined Patent Application Publication No. 2014-007399 are incorporated herein by reference.

The oxide semiconductor layer 13 may contain at least one metal element selected, for example, from In, Ga, and Zn. In this embodiment, the oxide semiconductor layer 13 contains, for example, an In—Ga—Zn—O-based semiconductor (e.g., indium gallium zinc oxide). The In—Ga—Zn—O-based semiconductor is a ternary oxide of In (indium), Ga (gallium), and Zn (zinc), and In, Ga, and Zn may be in any ratio (composition ratio), for example, In:Ga:Zn=2:2:1, In:Ga:Zn=1:1:1, or In:Ga:Zn=1:1:2. The oxide semiconductor layer 13 having such a composition can be formed from an oxide semiconductor film containing an In—Ga—Zn—O-based semiconductor.

The In—Ga—Zn—O-based semiconductor may be amorphous or may be crystalline (may have a crystalline portion). A preferred crystalline In—Ga—Zn—O-based semiconductor is a crystalline In—Ga—Zn—O-based semiconductor whose c axis is oriented substantially perpendicularly to its layer plane.

The crystal structure of a crystalline In—Ga—Zn—O-based semiconductor is disclosed, for example, in Japanese Unexamined Patent Application Publication No. 2014-007399 described above, Japanese Unexamined Patent Application Publication No. 2012-134475, and Japanese Unexamined Patent Application Publication No. 2014-209727. The entire contents of Japanese Unexamined Patent Application Publication No. 2012-134475 and Japanese Unexamined Patent Application Publication No. 2014-209727 are incorporated herein by reference. A TFT including an In—Ga—Zn—O-based semiconductor layer has a high mobility (more than 20 times as high as that of an a-Si TFT) and a low leak current (less than one-hundredth of that of an a-Si TFT) and thus is suitable for use as a drive TFT (e.g., a TFT included in a drive circuit on the periphery of a display area including a plurality of pixels, the drive circuit and the display area being disposed on the same substrate) and a pixel TFT (a TFT disposed in a pixel).

The oxide semiconductor layer 13 may contain another oxide semiconductor instead of the In—Ga—Zn—O-based semiconductor. For example, the oxide semiconductor layer 13 may contain an In—Sn—Zn—O-based semiconductor (e.g., $In_2O_3$—$SnO_2$—ZnO; InSnZnO). The In—Sn—Zn—O-based semiconductor is a ternary oxide of In (indium), Sn (tin), and Zn (zinc). Alternatively, the oxide semiconductor layer 13 may contain, for example, an In—Al—Zn—O-based semiconductor, an In—Al—Sn—Zn—O-based semiconductor, a Zn—O-based semiconductor, an In—Zn—O-based semiconductor, a Zn—Ti—O-based semiconductor, a Cd—Ge—O-based semiconductor, a Cd—Pb—O-based semiconductor, CdO (cadmium oxide), a Mg—Zn—O-based semiconductor, an In—Ga—Sn—O-based semiconductor, an In—Ga—O-based semiconductor, a Zr—In—Zn—O-based semiconductor, a Hf—In—Zn—O-based semiconductor, an Al—Ga—Zn—O-based semiconductor, or a Ga—Zn—O-based semiconductor.

Embodiment 7

Hereinafter, an active matrix substrate according to this embodiment will be described with reference to the drawings. The active matrix substrate according to this embodiment includes an oxide semiconductor TFT and a crystalline silicon TFT formed on a single substrate.

The active matrix substrate includes a TFT (pixel TFT) for each pixel. As the pixel TFT, an oxide semiconductor TFT including an In—Ga—Zn—O-based semiconductor film as an active layer is used, for example.

A peripheral drive circuit may be partially or wholly formed in an integral manner on a substrate on which the pixel TFT is also formed. Such an active matrix substrate is called a driver monolithic active matrix substrate. In the driver monolithic active matrix substrate, the peripheral drive circuit is disposed in an area (non-display area or picture-frame area) other than an area (display area) including a plurality of pixels. As a TFT (circuit TFT) of the peripheral drive circuit, a crystalline silicon TFT including a polycrystalline silicon film as an active layer is used, for example. The use of an oxide semiconductor TFT as the pixel TFT and a crystalline silicon TFT as the circuit TFT enables reduced power consumption in the display area and, moreover, a smaller picture-frame area.

As the pixel TFT, the TFT described above with reference to FIG. 1 can be used. This will be described later.

Next, a more specific configuration of the active matrix substrate according to this embodiment will be described with reference to the drawings.

Figure 21:
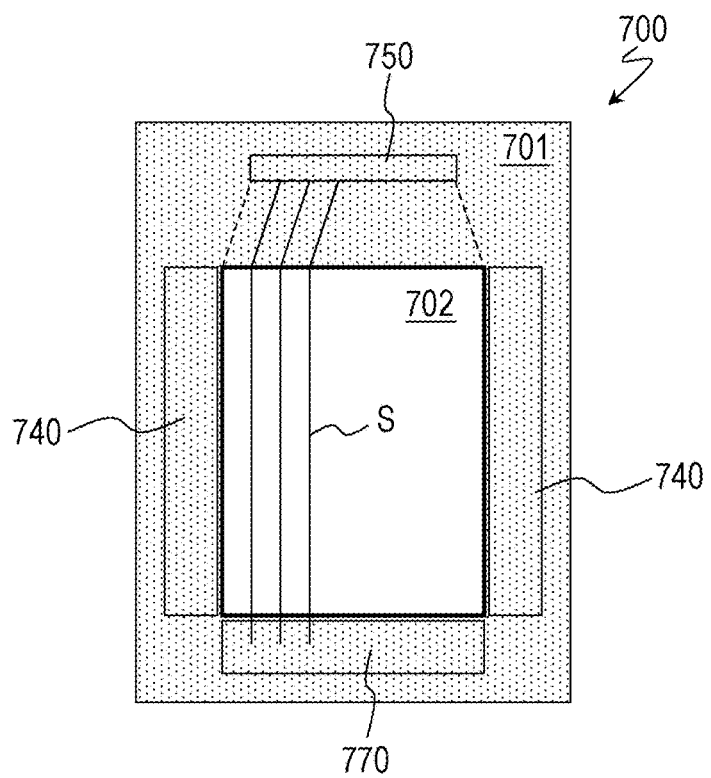
FIG. 21 is a schematic plan view illustrating an exemplary planar structure of an active matrix substrate 700 according to an embodiment of the present invention.
Figure 22:
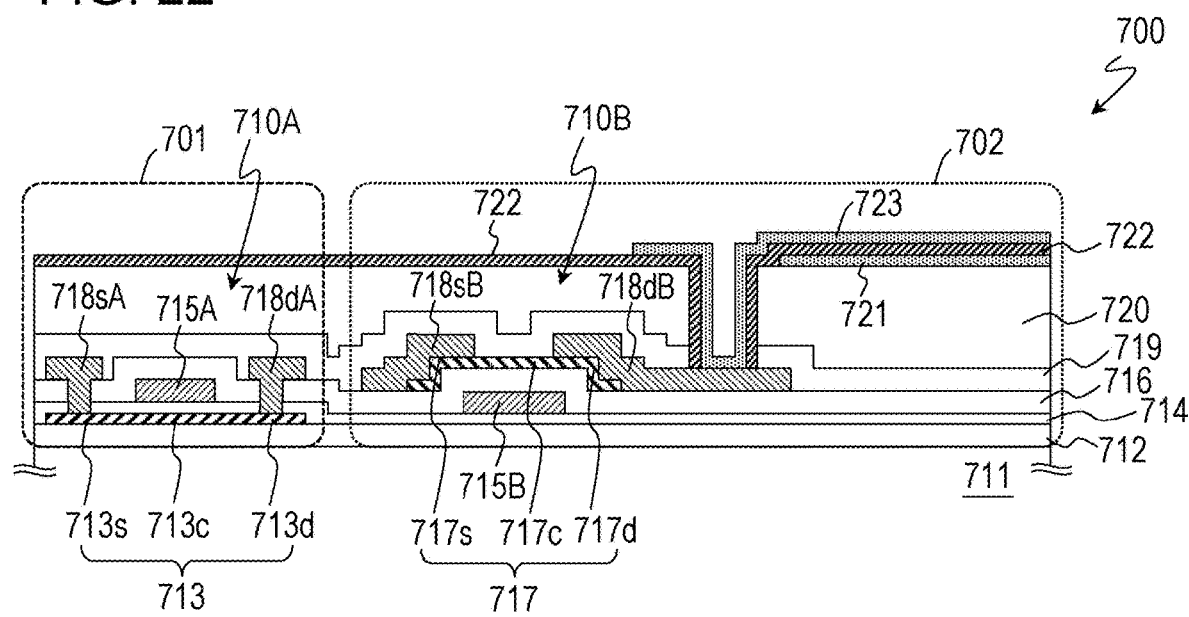
FIG. 22 is a sectional view of a crystalline silicon TFT 710A and an oxide semiconductor TFT 710B in the active matrix substrate 700.

FIG. 21 is a schematic plan view illustrating an exemplary planar structure of an active matrix substrate 700 according to this embodiment. FIG. 22 is a sectional view of sectional structures of a crystalline silicon TFT (hereinafter referred to as a "first thin film transistor") 710A and an oxide semiconductor TFT (hereinafter referred to as a "second thin film transistor") 710B in the active matrix substrate 700.

As illustrated in FIG. 21, the active matrix substrate 700 has a display area 702 including a plurality of pixels and an area (non-display area) other than the display area 702. The non-display area includes a drive-circuit formation area 701 in which a drive circuit is disposed. For example, a gate driver circuit 740, an inspection circuit 770, etc. are disposed in the drive-circuit formation area 701. A plurality of gate bus lines (not illustrated) extending in a row direction and a plurality of source bus lines S extending in a column direction are formed in the display area 702. Although not illustrated, the pixels are defined, for example, by the gate bus lines and the source bus lines S. The gate bus lines are connected to their respective terminals of the gate driver circuit. The source bus lines S are connected to their respective terminals of a driver IC 750 mounted on the active matrix substrate 700.

As illustrated in FIG. 22, in the active matrix substrate 700, the second thin film transistor 710B serving as a pixel TFT is formed for each pixel in the display area 702, and the first thin film transistor 710A serving as a circuit TFT is formed in the drive-circuit formation area 701.

The active matrix substrate 700 includes a substrate 711, an underlying film 712 formed on a surface of the substrate 711, the first thin film transistor 710A formed on the underlying film 712, and the second thin film transistor 710B formed on the underlying film 712. The first thin film transistor 710A is a crystalline silicon TFT having an active region mainly containing crystalline silicon. The second thin film transistor 710B is an oxide semiconductor TFT having an active region mainly containing an oxide semiconductor. The first thin film transistor 710A and the second thin film transistor 710B are formed integrally with the substrate 711. The term "active region" as used herein refers to a region in a semiconductor layer serving as an active layer of a TFT, in which region a channel is formed.

The first thin film transistor 710A includes a crystalline silicon semiconductor layer (e.g., a low-temperature polysilicon layer) 713 formed on the underlying film 712, a first insulating layer 714 covering the crystalline silicon semiconductor layer 713, and a gate electrode 715A disposed on the first insulating layer 714. In the first insulating layer 714, a portion located between the crystalline silicon semiconductor layer 713 and the gate electrode 715A functions as a gate insulating film of the first thin film transistor 710A. The crystalline silicon semiconductor layer 713 has a channel formation region (active region) 713$c$, and a source region 713$s$ and a drain region 713$d$ located on opposite sides of the active region. In this example, the active region 713$c$ is a portion of the crystalline silicon semiconductor layer 713 that overlaps the gate electrode 715A with the first insulating layer 714 interposed therebetween. The first thin film transistor 710A further includes a source electrode 718$s$A connected to the source region 713$s$ and a drain electrode 718$d$A connected to the drain region 713$d$. The source and drain electrodes 718$s$A and 718$d$A may be disposed on an interlayer insulating film (in this case, a second insulating layer 716) covering the gate electrode 715A and the crystalline silicon semiconductor layer 713 and may be connected to the crystalline silicon semiconductor layer 713 in contact holes formed in the interlayer insulating film.

The second thin film transistor 710B includes a gate electrode 715B disposed on the underlying film 712, the second insulating layer 716 covering the gate electrode 715B, and an oxide semiconductor layer 717 disposed on the second insulating layer 716. As illustrated, the first insulating layer 714 serving as the gate insulating film of the first thin film transistor 710A may extend to a region in which the second thin film transistor 710B is to be formed. In this case, the oxide semiconductor layer 717 may be formed on the first insulating layer 714. In the second insulating layer 716, a portion located between the gate electrode 715B and the oxide semiconductor layer 717 functions as a gate insulating film of the second thin film transistor 710B. The oxide semiconductor layer 717 has a channel formation region (active region) 717$c$, and a source contact region 717$s$ and a drain contact region 717$d$ located on opposite sides of the active region. In this example, the active region 717$c$ is a portion of the oxide semiconductor layer 717 that overlaps the gate electrode 715B with the second insulating layer 716 interposed therebetween. The second thin film transistor 710B further includes a source electrode 718$s$B connected to the source contact region 717$s$ and a drain electrode 718$d$B connected to the drain contact region 717$d$. The underlying film 712 need not be disposed on the substrate 711.

The thin film transistors 710A and 710B are covered with a passivation film 719 and a planarization film 720. In the second thin film transistor 710B serving as a pixel TFT, the gate electrode 715B is connected to a gate bus line (not illustrated), the source electrode 718$s$B is connected to a source bus line (not illustrated), and the drain electrode 718$d$B is connected to a pixel electrode 723. In this example, the drain electrode 718$d$B is connected to the corresponding pixel electrode 723 in an opening formed in the passivation film 719 and the planarization film 720. A video signal is supplied to the source electrode 718$s$B through the source bus line, and a necessary charge is written to the pixel electrode 723 in response to a gate signal from the gate bus line.

As illustrated, a transparent conductive layer 721 serving as a common electrode may be formed on the planarization film 720, and a third insulating layer 722 may be formed between the transparent conductive layer (common electrode) 721 and the pixel electrode 723. In this case, the pixel electrode 723 may be provided with a slit-shaped opening.

The active matrix substrate 700 having the above-described configuration can be used, for example, for an FFS mode display device. The FFS mode is a lateral electric-field mode in which a pair of electrodes is disposed on one substrate and an electric field is applied to liquid crystal molecules in a direction parallel to the substrate surface (the lateral direction). In this example, an electric field represented by a line of electric force extending from the pixel electrode 723 to the common electrode 721 through a liquid crystal layer (not illustrated) and through the slit-shaped opening of the pixel electrode 723 is generated. This electric field has a lateral component with respect to the liquid crystal layer. Therefore, a lateral electric field can be applied to the liquid crystal layer. The lateral electric-field mode is advantageous in that liquid crystal molecules do not rise from a substrate and thus a wider viewing angle than in a longitudinal electric-field mode can be achieved.

As the second thin film transistor 710B in this embodiment, the TFT 10 in the embodiment 1 described with reference to FIG. 1 can be used. When the TFT 10 in FIG. 1 is used, the gate electrode 11, the gate insulating layer 12, the oxide semiconductor layer 13, the source electrode 14, and the drain electrode 15 in the TFT 10 respectively correspond to the gate electrode 715B, the second insulating layer (gate insulating layer) 716, the oxide semiconductor layer 717, the source electrode 718sB, and the drain electrode 718dB illustrated in FIG. 22. The inorganic insulating layer 20, the organic insulating layer 21, the common electrode 22, the dielectric layer 23, and the pixel electrode 24 in the active matrix substrate 100A in FIG. 1 correspond to the passivation film 719, the planarization film 720, the transparent conductive layer 721, the third insulating layer 722, and the pixel electrode 723 illustrated in FIG. 22.

As a TFT (inspection TFT) of the inspection circuit 770 illustrated in FIG. 21, the thin film transistor 710B, which is an oxide semiconductor TFT, may be used.

Although not illustrated, the inspection TFT and the inspection circuit may be formed, for example, in a region in which the driver IC 750 illustrated in FIG. 21 is mounted. In this case, the inspection TFT is disposed between the driver IC 750 and the substrate 711.

In the example illustrated, the first thin film transistor 710A has a top-gate structure in which the crystalline silicon semiconductor layer 713 is disposed between the gate electrode 715A and the substrate 711 (the underlying film 712). The second thin film transistor 710B has a bottom-gate structure in which the gate electrode 715B is disposed between the oxide semiconductor layer 717 and the substrate 711 (the underlying film 712). These structures can more effectively suppress increases in the number of production steps and in production cost in forming the two thin film transistors 710A and 710B integrally on the single substrate 711.

The TFT structures of the first thin film transistor 710A and the second thin film transistor 710B are not limited to the above-described structures. For example, the thin film transistors 710A and 710B may have the same TFT structure (bottom-gate structure). The bottom-gate structure may be a channel-etch structure, as in the thin film transistor 710B, or may be an etch-stop structure. Alternatively, a bottom-contact structure in which a source electrode and a drain electrode are located below a semiconductor layer may be used.

The second insulating layer 716 serving as a gate insulating film of the second thin film transistor 710B may extend to the region in which the first thin film transistor 710A is formed and may function as an interlayer insulating film covering the gate electrode 715A and the crystalline silicon semiconductor layer 713 of the first thin film transistor 710A.

The gate electrode 715A of the first thin film transistor 710A and the gate electrode 715B of the second thin film transistor 710B may be formed in the same layer. The source and drain electrodes 718sA and 718dA of the first thin film transistor 710A and the source and drain electrodes 718sB and 718dB of the second thin film transistor 710B may be formed in the same layer. The phrase "formed in the same layer" means being formed using the same film (conductive film). This can suppress increases in the number of production steps and in production cost.

INDUSTRIAL APPLICABILITY

According to the embodiments of the present invention, tinge variation can be reduced during the production of a liquid crystal display panel including an active matrix substrate that includes an oxide semiconductor TFT and a gate insulating layer and/or inorganic insulating layer having a multilayer structure.

REFERENCE SIGNS LIST 1 substrate
10 TFT (thin film transistor)
11 gate electrode
12 gate insulating layer
12a silicon oxide layer
12b silicon nitride layer
12c intermediate layer
12d first layer
12e second layer
13 oxide semiconductor layer
14 source electrode
15 drain electrode
20 inorganic insulating layer (passivation film)
20a silicon oxide layer
20b silicon nitride layer
20c intermediate layer
20d first layer
20e second layer
21 organic insulating layer (planarization film)
22 common electrode
23 dielectric layer
24 pixel electrode
80 liquid crystal layer
100A, 100B, 100C active matrix substrate
100D, 100E, 100F active matrix substrate
100M first mother substrate
200 opposite substrate
200M second mother substrate
300 liquid crystal display panel
300M mother panel
CH contact hole

The invention claimed is:
1. An active matrix substrate comprising:
a substrate;
a plurality of thin film transistors supported on the substrate; and
an inorganic insulating layer covering the plurality of thin film transistors, wherein each of the plurality of thin film transistors includes:
a gate electrode,
an oxide semiconductor layer facing the gate electrode, a gate insulating layer located between the gate electrode and the oxide semiconductor layer, and a source electrode and a drain electrode that are electrically connected to the oxide semiconductor layer, at least one of the gate insulating layer and the inorganic insulating layer is an insulating layer stack having a multilayer structure including a silicon oxide layer and a silicon nitride layer, the insulating layer stack further includes an intermediate layer disposed between the silicon oxide layer and the silicon nitride layer, the intermediate layer having a refractive index $n_C$ higher than a refractive index $n_A$ of the silicon oxide layer and lower than a refractive index $n_B$ of the silicon nitride layer, the refractive index $n_A$, of the silicon oxide layer, the refractive index $n_B$ of the silicon nitride layer, and the refractive index $n_C$ of the intermediate layer satisfy a relation $1.13 \cdot n_A \leq n_C \leq 0.93 \cdot n_B$, and of the gate insulating layer and the inorganic insulating layer, the gate insulating layer is the insulating layer stack including the intermediate layer.

2. The active matrix substrate according to claim 1, wherein the intermediate layer is a silicon oxynitride layer.

3. The active matrix substrate according to claim 1, wherein the silicon oxide layer is located between the oxide semiconductor layer and the intermediate layer.

4. The active matrix substrate according to claim 1, wherein the oxide semiconductor layer contains an In—Ga—Zn—O-based semiconductor.

5. The active matrix substrate according to claim 4, wherein the In—Ga—Zn—O-based semiconductor has a crystalline portion.

6. A liquid crystal display panel comprising:

the active matrix substrate according to claim 1;

an opposite substrate facing the active matrix substrate; and a liquid crystal layer disposed between the active matrix substrate and the opposite substrate.

* * * * *